(12) United States Patent
Cheng et al.

(10) Patent No.: US 11,322,410 B2
(45) Date of Patent: May 3, 2022

(54) THRESHOLD VOLTAGE TUNING FOR FIN-BASED INTEGRATED CIRCUIT DEVICE

(71) Applicant: Taiwan Semiconductor Manufacturing Co., Ltd., Hsin-Chu (TW)

(72) Inventors: Chung-Liang Cheng, Changhua County (TW); Wei-Jen Chen, Taichung (TW); Yen-Yu Chen, Taichung (TW); Ming-Hsien Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/199,498

(22) Filed: Nov. 26, 2018

(65) Prior Publication Data

US 2019/0139828 A1 May 9, 2019

Related U.S. Application Data

(62) Division of application No. 15/808,285, filed on Nov. 9, 2017, now Pat. No. 10,790,196.

(51) Int. Cl.
*H01L 27/02* (2006.01)
*H01L 21/8234* (2006.01)
(Continued)

(52) U.S. Cl.
CPC .. *H01L 21/82345* (2013.01); *H01L 21/02068* (2013.01); *H01L 21/32134* (2013.01);
(Continued)

(58) Field of Classification Search
CPC combination set(s) only.
See application file for complete search history.

(56) References Cited

U.S. PATENT DOCUMENTS

| 9,362,385 B2 | 6/2016 | Cheng et al. |
| 2014/0252477 A1* | 9/2014 | Tseng ............... H01L 29/66795 257/347 |

(Continued)

FOREIGN PATENT DOCUMENTS

| CN | 106409830 A | 2/2017 |
| KR | 20050038630 A | 4/2005 |

(Continued)

*Primary Examiner* — Moin M Rahman
(74) *Attorney, Agent, or Firm* — Haynes and Boone, LLP

(57) ABSTRACT

Methods for tuning threshold voltages of fin-like field effect transistor (FinFET) devices are disclosed herein. An exemplary integrated circuit device includes a high voltage n-type FinFET, a high voltage p-type FinFET, a low voltage n-type FinFET, and a low voltage p-type FinFET. Threshold voltages of the high voltage n-type FinFET and the high voltage p-type FinFET are greater than threshold voltages of the low voltage n-type FinFET and the low voltage p-type FinFET, respectively. The high voltage n-type FinFET, the high voltage p-type FinFET, the low voltage n-type FinFET, and the low voltage p-type FinFET each include a threshold voltage tuning layer that includes tantalum and nitrogen. Thicknesses of the threshold voltage tuning layer of the low voltage n-type FinFET and the low voltage p-type FinFET are less than thicknesses of the threshold voltage tuning layer of the high voltage n-type FinFET and the high voltage p-type FinFET, respectively.

20 Claims, 14 Drawing Sheets

(51) Int. Cl.

| | | |
|---|---|---|
| *H01L 21/3213* | (2006.01) | |
| *H01L 27/092* | (2006.01) | |
| *H01L 21/8238* | (2006.01) | |
| *H01L 21/02* | (2006.01) | |
| *H01L 27/088* | (2006.01) | |
| *H01L 27/12* | (2006.01) | |

(52) U.S. Cl.
CPC .. *H01L 21/32136* (2013.01); *H01L 21/32137* (2013.01); *H01L 21/823431* (2013.01); *H01L 21/823842* (2013.01); *H01L 27/088* (2013.01); *H01L 27/0886* (2013.01); *H01L 27/092* (2013.01); *H01L 27/0924* (2013.01); *H01L 21/3213* (2013.01); *H01L 27/1211* (2013.01)

(56) References Cited

U.S. PATENT DOCUMENTS

| | | | |
|---|---|---|---|
| 2015/0221743 A1 | 8/2015 | Ho et al. | |
| 2015/0243658 A1 | 8/2015 | Joshi et al. | |
| 2015/0357244 A1 | 12/2015 | Ragnarsson et al. | |
| 2015/0380407 A1 | 12/2015 | Ji et al. | |
| 2016/0093536 A1 | 3/2016 | Yang et al. | |
| 2016/0104786 A1 | 4/2016 | Yang et al. | |
| 2016/0163603 A1* | 6/2016 | Bao | H01L 21/823842 257/412 |
| 2016/0225868 A1* | 8/2016 | Kim | H01L 27/0886 |
| 2016/0276214 A1 | 9/2016 | Fu et al. | |
| 2016/0336194 A1* | 11/2016 | Yeh | H01L 21/823821 |
| 2016/0348234 A1 | 12/2016 | Suzuki | |
| 2017/0005175 A1 | 1/2017 | Song et al. | |
| 2017/0062282 A1* | 3/2017 | Lin | H01L 27/092 |
| 2017/0110324 A1 | 4/2017 | Tsai et al. | |
| 2017/0110552 A1 | 4/2017 | Lee et al. | |
| 2017/0213826 A1* | 7/2017 | Kim | H01L 29/7854 |
| 2017/0365527 A1* | 12/2017 | Zhou | H01L 21/823842 |
| 2018/0233507 A1* | 8/2018 | Kim | H01L 21/32139 |

FOREIGN PATENT DOCUMENTS

| | | |
|---|---|---|
| KR | 20160001092 A | 1/2016 |
| KR | 20170005282 A | 1/2017 |
| TW | 1475600 B | 3/2015 |
| TW | 1538164 B | 6/2016 |
| TW | 1566279 B | 1/2017 |

* cited by examiner

THRESHOLD VOLTAGE TUNING FOR FIN-BASED INTEGRATED CIRCUIT DEVICE

This is a divisional application of U.S. patent application Ser. No. 15/808,285, filed Nov. 9, 2017, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, gate replacement processes, which typically involve replacing polysilicon gate electrodes with metal gate electrodes, have been implemented to improve device performance, where work function values of the metal gate electrodes are tuned during the gate replacement process to provide various devices having different threshold (operating) voltages. Although existing gate replacement processes and corresponding threshold voltage tuning processes have been generally adequate for their intended purposes, they have not been entirely satisfactory in all respects as IC technologies shrink.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figures 1A, 1B:
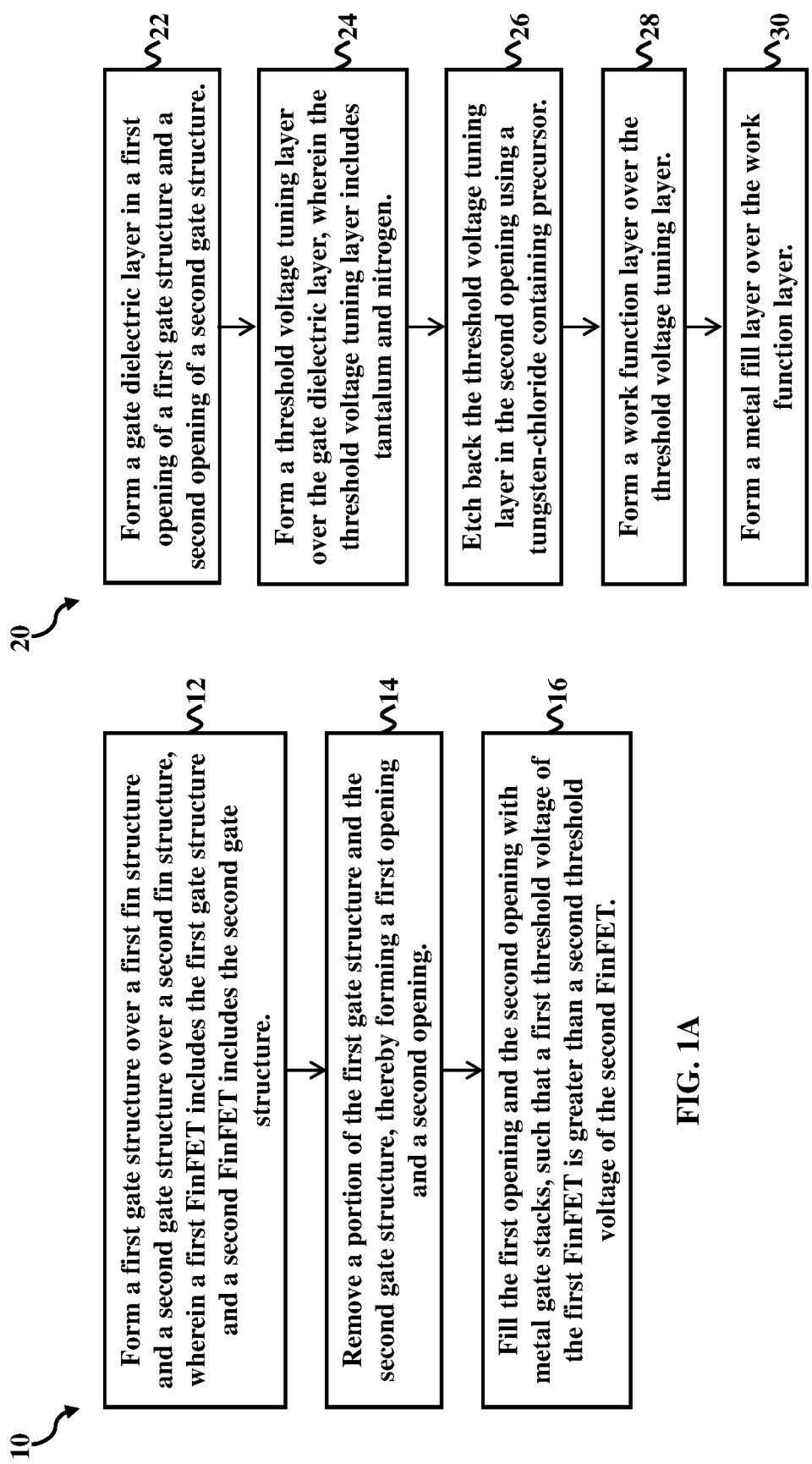
FIG. 1A is a flow chart of a method for fabricating a fin-based integrated circuit device according to various aspects of the present disclosure.
FIG. 1B is a flow chart of a method for fabricating metal gate stacks for a fin-based integrated circuit device, which can be implemented in the method of FIG. 1A, according to various aspects of the present disclosure.

The present disclosure relates generally to integrated circuit devices, and more particularly, to voltage threshold tuning for fin-based integrated circuit devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Various methods for forming gate stacks and related gate structures are disclosed herein, which may be implemented in any of a variety of device types. For example, aspects of the present disclosure may be implemented to form gate stacks suitable for planar field-effect transistors (FETs), multi-gate transistors (planar or vertical), such as fin-like FET (FinFET) devices, gate-all-around (GAA) devices, omega-gate (Ω-gate) devices, or pi-gate (Π-gate) devices, as well as strained-semiconductor devices, silicon-on-insulator (SOI) devices, partially-depleted SOI devices, fully-depleted SOI devices, or other devices. The present disclosure contemplates that one of ordinary skill may recognize other integrated circuit devices that can benefit from the gate formation methods and/or gate structures described herein.

FIG. 1A is a flow chart of a method 10 for fabricating an integrated circuit device according to various aspects of the present disclosure. At block 12, method 10 includes forming a first gate structure over a first fin structure and a second gate structure over a second fin structure. A first FinFET includes the first gate structure and a second FinFET includes the second gate structure. At block 14, method 10 includes removing a portion of the first gate structure and the second gate structure, thereby forming a first opening and a second opening. In some implementations, a dummy gate stack (including, for example, a polysilicon gate electrode) is removed from the first gate structure and the second gate structure. At block 16, method 10 includes filling the first opening and the second opening with metal gate stacks, such that a first threshold voltage of the first FinFET is greater than a second threshold voltage of the second FinFET. Method 10 can continue to complete fabrication of the first FinFET and the second FinFET. For example, a multi-layer interconnect structure can be fabricated for facilitating operation of the first FinFET and the second FinFET. Additional steps can be provided before, during, and after method 10, and some of the steps described can be moved, replaced, or eliminated for additional embodiments of method 10.

FIG. 1B is a flow chart of a method 20 for fabricating metal gate stacks, which can be implemented in block 16 of method 10 of FIG. 1A, according to various aspects of the present disclosure. At block 22, method 20 includes forming a gate dielectric layer, such as a high-k dielectric layer, in a first opening of a first gate structure and a second opening of a second gate structure. A first FinFET can include the first gate structure, and a second FinFET can include the second gate structure. At block 24, method 20 includes forming a threshold voltage tuning layer over the gate dielectric layer. The threshold voltage tuning layer includes a material that has a work function value that depends on a thickness of the threshold voltage tuning layer. For example, the threshold voltage tuning layer includes tantalum and nitrogen. In some implementations, a capping layer is formed over the gate dielectric layer before forming the threshold voltage tuning layer. At block 26, method 20 includes etching back the threshold voltage tuning layer in the second opening using a tungsten-chloride containing precursor. The etching back reduces a thickness of the threshold voltage tuning layer of the second gate structure, thereby reducing a threshold voltage of the second FinFET. At block 28, method 20 includes forming a work function layer over the threshold voltage tuning layer. In some implementations, the work function layer is formed after the etching back. In some implementations, the work function layer is formed before the etching back. In such implementations, the work function layer is removed from the second opening before the etching back. In some implementations, the work function layer includes a first work function layer that is formed over the threshold voltage tuning layer before the etching back and a second work function layer that is formed after the etching back. In such implementations, the first work function layer is removed from the second opening before the etching back. In some implementations, the second work function layer is formed in only the first opening. At block 30, method 20 includes forming a metal fill layer over the work function layer. Additional steps can be provided before, during, and after method 20, and some of the steps described can be moved, replaced, or eliminated for additional embodiments of method 20.

FIGS. 2A-2L are fragmentary diagrammatic views of a fin-based integrated circuit device 100, in portion or entirety, at various fabrication stages (such as those associated with method 10 in FIG. 1A and FIG. 1B) according to various aspects of the present disclosure. Fin-based integrated circuit device 100 may be included in a microprocessor, a memory, and/or other integrated circuit device. In some implementations, fin-based integrated circuit device 100 may be a portion of an IC chip, a system on chip (SoC), or portion thereof, that includes various passive and active microelectronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors may be planar transistors or multi-gate transistors, such as FinFETs, depending on design requirements of fin-based integrated circuit device 100. FIGS. 2A-2L have been simplified for the sake of clarity to better understand the inventive concepts of the present disclosure. Additional features can be added in fin-based integrated circuit device 100, and some of the features described below can be replaced, modified, or eliminated in other embodiments of fin-based integrated circuit device 100.

Figure 2A:
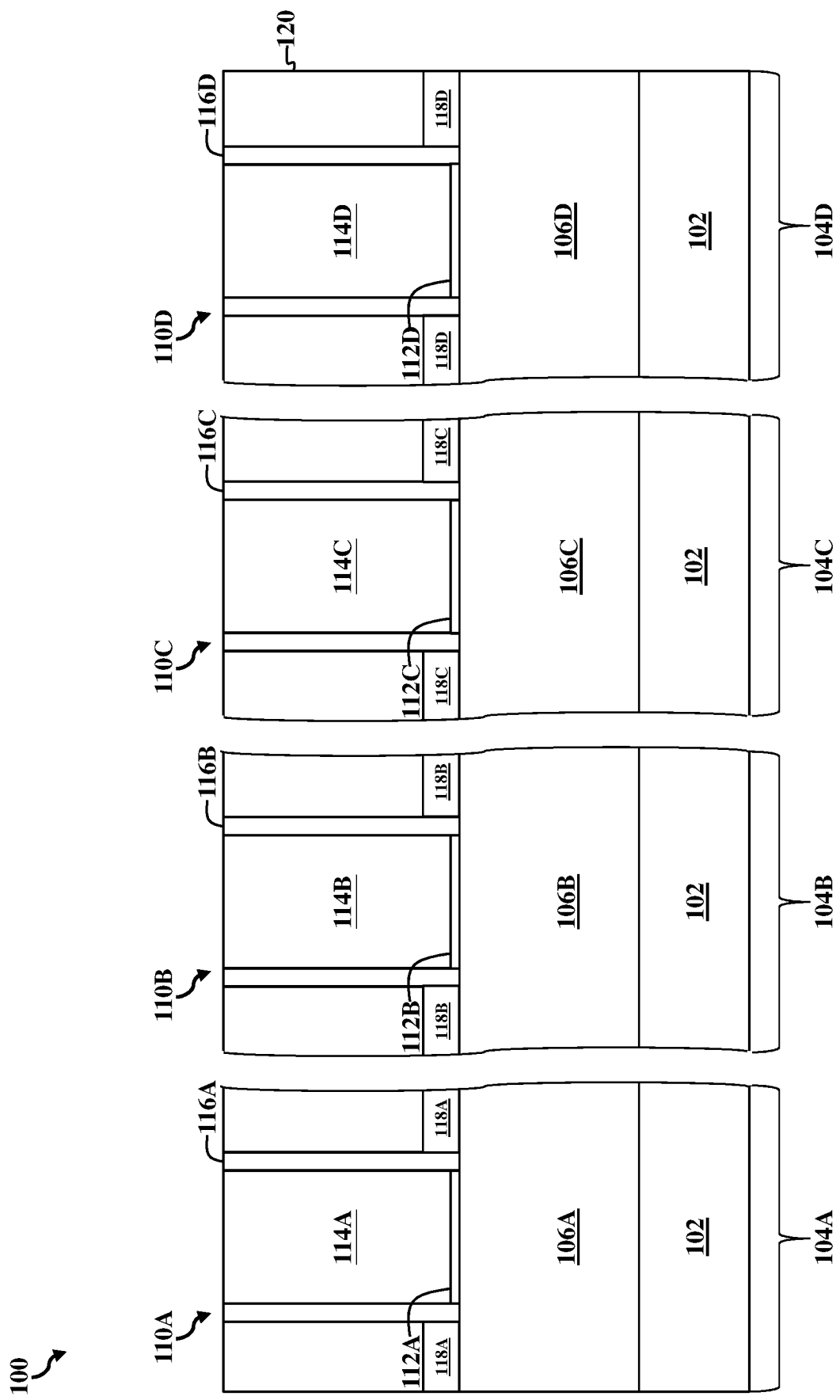
FIGS. 2A-2L are fragmentary diagrammatic views of a fin-based integrated circuit device, in portion or entirety, at various fabrication stages, such as those associated with the method of FIG. 1, according to various aspects of the present disclosure.

Turning to FIG. 2A, fin-based integrated circuit device 100 includes a substrate (wafer) 102. Various regions are defined for substrate 102, such as a high-voltage n-type (HV-N) region 104A, a low-voltage n-type (LV-N) region 104B, a low-voltage p-type (LV-P) region 104C, and a high-voltage p-type (HV-P) region 104D. HV-N region 104A and HV-P region 104D include high voltage transistors (HVTs), and LV-N region 104B and LV-P region 104C include low voltage transistors (LVTs), where a threshold voltage ($V_t$) of HVTs is greater than a threshold voltage of LVTs. In some implementations, n-type transistors have a threshold of about 0.1 V to about 0.25 V, and p-type transistors have a threshold voltage of about 0.14 V to about 0.29 V, where a threshold voltage of an n-type transistor in HV-N region 104A is higher than a threshold voltage of an n-type transistor in LV-N region 104B and a threshold voltage of a p-type transistor in HV-P region 104D is higher than a threshold voltage of a p-type transistors in LV-P region 104C. In some implementations, LVTs are logic transistors, core transistors, SRAM transistors, input/output (I/O) transistors, or other devices that operate using a substantially nominal voltage. In some implementations, HVTs include I/O transistors that convert a higher threshold, input voltage (for example, a power supply voltage) to a lower threshold voltage suitable for LVTs, such as core transistors. In furtherance of the depicted embodiment, as further described below, HV-N region 104A, LV-N region 104B, LV-P region 104C, and HV-P region 104D include one or more FinFETs configured as HVTs and/or LVTs. In some implementations, HV-N region 104A, LV-N region 104B, LV-P region 104C, and/or HV-P region 104D may or may not be contiguous and any number of devices and/or device features (for example, isolation features, dummy features, and/or other device features) may be formed between HV-N region 104A, LV-N region 104B, LV-P region 104C, and/or HV-P region 104D depending on design requirements of fin-based integrated circuit device 100. Furthermore, HVTs and/or LVTs can have different threshold voltages (operating voltages) than those explicitly described herein depending on design requirements of fin-based integrated circuit device 100.

In the depicted embodiment, substrate 102 is a semiconductor substrate, including, for example, silicon. Alternatively or additionally, substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 102 can include various doped regions (not shown) depending on device requirements of HV-N region 104A, LV-N region 104B, LV-P region 104C, and/or HV-P region 104D. In some implementations, substrate 102 includes p-type doped regions (for example, p-type wells) doped with p-type dopants, such as boron (for example, $BF_2$), indium, other p-type dopant, or combinations thereof. In some implementations, substrate 102 includes n-type doped regions (for example, n-type wells) doped with n-type dopants, such as phosphorus, arsenic, other n-type dopant, or combinations thereof. In some implementations, substrate 102 includes doped regions formed with a combination of p-type dopants and n-type dopants. The various doped regions can be formed directly on and/or in substrate 102, for example, providing a p-well structure, an n-well structure, a dual-well structure, a raised structure, or combinations thereof. An ion implantation process, a diffusion process, and/or other suitable doping process can be performed to form the various doped regions of substrate 102.

HV-N region 104A, LV-N region 104B, LV-P region 104C, and HV-P region 104D each include at least one fin structure, such as fin structure 106A, fin structure 106B, fin structure 106C, and fin structure 106D, respectively. Though not evident in the depicted view, fin structure 106A, fin structure 106B, fin structure 106C, and/or fin structure 106D can include more than one fin depending on design requirements of their respective FinFET device. In some implementations, fin structures 106A-106D are a portion of substrate 102 (such as a portion of a material layer of substrate 102). For example, where substrate 102 includes silicon, fin structures 106A-106D include silicon. Alternatively, in some implementations, fin structures 106A-106D are defined in a material layer, such as one or more semiconductor material layers, overlying substrate 102. For example, fin structures 106A-106D can include a semiconductor layer stack having various semiconductor layers (such as a heterostructure) disposed over substrate 102. The semiconductor layers can include any suitable semiconductor materials, such as silicon, germanium, silicon germanium, other suitable semiconductor materials, or combinations thereof. The semiconductor layers can include the same or different materials, etching rates, constituent atomic percentages, constituent weight percentages, thicknesses, and/or configurations depending on design requirements of fin-based integrated circuit device 100. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b/Si_cGe_d/Si_aGe_b/Si_cGe_d$ from bottom to top, where a and c are different atomic percentages of silicon and b and d are different atomic percentages of germanium). In some implementations, fin structure 106A, fin structure 106B, fin structure 106C, and/or fin structure 106D include the same materials and/or the same semiconductor layer stacks depending on design requirements of their respective FinFET device. In some implementations, fin structure 106A, fin structure 106B, fin structure 106C, and/or fin structure 106D include different materials and/or different semiconductor layer stacks depending on design requirements of their respective FinFET device.

Fin structures 106A-106D are formed over substrate 102 using any suitable process. In some implementations, a combination of deposition, lithography and/or etching processes are performed to define fin structures 106A-106D extending from substrate 102 as illustrated in FIG. 2A. For example, forming fin structures 106A-106D includes performing a lithography process to form a patterned resist layer over substrate 102 (or a material layer, such as a heterostructure, disposed over substrate 102) and performing an etching process to transfer a pattern defined in the patterned resist layer to substrate 102 (or the material layer, such as the heterostructure, disposed over substrate 102). The lithography process can include forming a resist layer on substrate 102 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 102 (or a material layer disposed over substrate 102). The etching process can include a dry etching process (for example, a reactive ion etching (RIE) process), a wet etching process, other suitable etching process, or combinations thereof. After the etching process, the patterned resist layer is removed from substrate 102, for example, by a resist stripping process. Alternatively, fin structures 106A-106D are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming fin structures 106A-106D. Further, in some implementations, the exposure process can implement maskless lithography, electron-beam (e-beam) writing, ion-beam writing and/or nanoprint technology for patterning the resist layer.

Isolation feature(s) are formed over and/or in substrate 102 to isolate various regions and/or features of fin-based integrated circuit device 100. For example, isolation features define and electrically isolate HV-N region 104A, LV-N region 104B, LV-P region 104C, and/or HV-P region 104D from each other, fin structures 106A-106D from each other, and/or fins of fin structures 106A-106D from each other. Isolation features include silicon oxide, silicon nitride, silicon oxynitride, other suitable isolation material (for example, including silicon, oxygen, nitrogen, carbon, or other suitable isolation constituent), or combinations thereof. Isolation features can include different structures, such as shallow trench isolation (STI) structures, deep trench isolation (DTI) structures, and/or local oxidation of silicon (LOCOS) structures. In some implementations, isolation features are formed by etching a trench in substrate 102 and filling the trench with insulator material (for example, using a chemical vapor deposition process or a spin-on glass process). A chemical mechanical polishing (CMP) process may be performed to remove excessive insulator material and/or planarize a top surface of isolation features. In some embodiments, isolation features can be formed by depositing an insulator material over substrate 102 after forming fin structures 106A-106D (in some implementations, such that the insulator material layer fills gaps (trenches) between fin structures 106A-106D) and etching back the insulator material layer. In some implementations, isolation features include a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation features include a dielectric layer disposed over a doped liner layer (including, for example, boron silicate glass (BSG) or phosphosilicate glass (PSG)).

Various gate structures are disposed over fin structures 106A-106D, such as a gate structure 110A disposed over fin structure 106A, a gate structure 110B disposed over fin structure 106B, a gate structure 110C disposed over fin structure 106C, and a gate structure 110D disposed over fin structure 106D. Though not evident in the depicted view, gate structures 110A-110D wrap a portion of fin structures 106A-106D, respectively, such that gate structures 110A-110D interpose a source region and a drain region (collectively referred to as source/drain regions) of fin structures 106A-106D, respectively. Gate structures 110A-110D engage channel regions defined between the source regions and the drain regions, such that current can flow between the source/drain regions during operation. In the depicted embodiment, gate structures 110A-110D include gate stacks configured for a gate last process. For example, gate structures 110A-110D respectively include interfacial layers 112A-112D (including, for example, silicon and oxygen, such as silicon oxide) and dummy gate layers 114A-114D (including, for example, polysilicon). Dummy gate layers 114A-114D can include a multi-layer structure. For example, in some implementations, dummy gate layers 114A-114D include a dummy gate dielectric layer and a dummy gate electrode layer. In some implementations, gate structures 110A-110D include polysilicon gates, such that dummy gate layers 114A-114D include a polysilicon layer. Gate structures 110A-110D are formed by deposition processes, lithography processes, etching processes, other suitable processes, or combinations thereof. For example, a thermal oxidation process may be performed to form an interfacial layer over substrate 102, particularly over fin structures 106A-106D. One or more deposition processes are then performed to form a dummy gate layer over the interfacial layer. In some implementations, a deposition process is performed to form a dummy gate dielectric layer over the interfacial layer, and a deposition process is performed to form a dummy gate electrode layer over the dummy gate dielectric layer. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the interfacial layer and the dummy gate layer (in some implementations, a dummy gate dielectric layer and a dummy gate electrode layer) to form dummy gate stacks, such that the dummy gate stacks (including interfacial layers 112A-112D and dummy gate layers 114A-114D) wrap channel regions of fin structures 106A-106D. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

Gate structures 110A-110D further include spacers 116A-116D, which are disposed adjacent to (for example, along sidewalls of) the gate stacks (here, interfacial layers 112A-112D and dummy gate layers 114A-114D, respectively). Spacers 116A-116D are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 102 and subsequently anisotropically etched to form spacers 116A-116D. In some implementations, spacers 116A-116D include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to the gate stacks. In such implementations, the various sets of spacers can include materials having different etch rates. For example, a first dielectric layer including silicon and oxygen (for example, silicon oxide) can be deposited over substrate 102 and subsequently anisotropically etched to form a first spacer set adjacent to the gate stacks, and a second dielectric layer including silicon and nitrogen (for example, silicon nitride) can be deposited over substrate 102 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in source/drain regions of fin structures 106A-106D before and/or after forming spacers 116A-116D, depending on design requirements of fin-based integrated circuit device 100.

Epitaxial source features and epitaxial drain features (referred to as epitaxial source/drain features) are disposed in source/drain regions of fin structures 106A-106D. For example, a semiconductor material is epitaxially grown on fin structures 106A-106D, forming epitaxial source/drain features 118A-118D over fin structures 106A-106D. In the depicted embodiment, gate structures 110A-110D respectively interpose epitaxial source/drain features 118A-118D. In some implementations, epitaxial source/drain features 118A-118D wrap source/drain regions of fin structures 106A-106D. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fin structures 106A-106D. Epitaxial source/drain features 118A-118D are doped with n-type dopants and/or p-type dopants depending on whether HVTs and/or LVTs are configured as n-type devices (for example, having n-channels) or p-type devices (for example, having p-channels). In the depicted embodiment, where HV-N region 104A and LV-N region 104B are configured with n-type FinFETs, epitaxial source/drain features 118A and epitaxial source/drain features 118B are epitaxial layers including silicon and/or carbon, where silicon-containing epitaxial layers or silicon-carbon-containing epitaxial layers are doped with phosphorous, other n-type dopant, or combinations thereof (for example, forming a Si:P epitaxial layer or a Si:C:P epitaxial layer). In furtherance of the depicted embodiment, where LV-P region 104C and HV-P region 104D are configured with p-type FinFETs, epitaxial source/drain features 118C and epitaxial source/drain features 118D are epitaxial layers including silicon and germanium, where the silicon germanium containing epitaxial layers are doped with boron, other p-type dopant, or combinations thereof (for example, forming a Si:Ge:B epitaxial layer). The present disclosure contemplates embodiments where epitaxial source/drain features 118A-118D, include the same or different materials and/or the same or different dopants. The present disclosure further contemplates embodiments where fin structures 106A-106D are recessed, such that epitaxial source/drain features 118A-118D are grown from recessed portions of fin structures 106A-106D. In some implementations, epitaxial source/drain features 118A-118D include materials and/or dopants that achieve desired tensile stress and/or compressive stress in the channel regions. In some implementations, epitaxial source/drain features 118A-118D are doped during deposition by adding impurities to a source material of the epitaxy process. In some implementations, epitaxial source/drain features 118A-118D are doped by an ion implantation process subsequent to a deposition process. In some implementations, annealing processes are performed to activate dopants in epitaxial source/drain features 118A-118D and/or other source/drain regions (for example, HDD regions and/or LDD regions).

An interlevel dielectric (ILD) layer 120 is disposed over substrate 102, particularly over fin structures 106A-106D and gate structures 110A-110D. In some implementations, ILD layer 120 is a portion of a multilayer interconnect (MLI) feature that electrically couples various devices (for example, transistors, resistors, capacitors, and/or inductors) and/or components (for example, gate structures and/or source/drain features) of fin-based integrated circuit device 100, such that the various devices and/or components can operate as specified by design requirements of fin-based integrated circuit device 100. ILD layer 120 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 120 has a multilayer structure having multiple dielectric materials. In some implementations, a contact etch stop layer (CESL) is disposed between ILD layer 120 and fin structures 106A-106D and/or gate structures 110A-110D. The CESL includes a material different than ILD layer 120, such as a dielectric material that is different than the dielectric material of ILD layer 120. In the depicted embodiment, where ILD layer 120 includes a low-k dielectric material, the CESL includes silicon and nitrogen (for example, silicon nitride or silicon oxynitride). ILD layer 120 and/or the CESL is formed over substrate 102, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layers 120 and/or the CESL are formed by a flowable CVD (FCVD) process that includes, for example, depositing a flowable material (such as a liquid compound) over substrate 102 and converting the flowable material to a solid material by a suitable technique, such as thermal annealing and/or ultraviolet radiation treating. Subsequent to the deposition of ILD layer 120 and/or the CESL, a CMP process and/or other planarization process is performed, such that a top portion of gate structures 110A-110D is reached (exposed). In the depicted embodiment, top surfaces of dummy gate layers 114A-114D are substantially planar with a top surface of ILD layer 120.

Figure 2B:
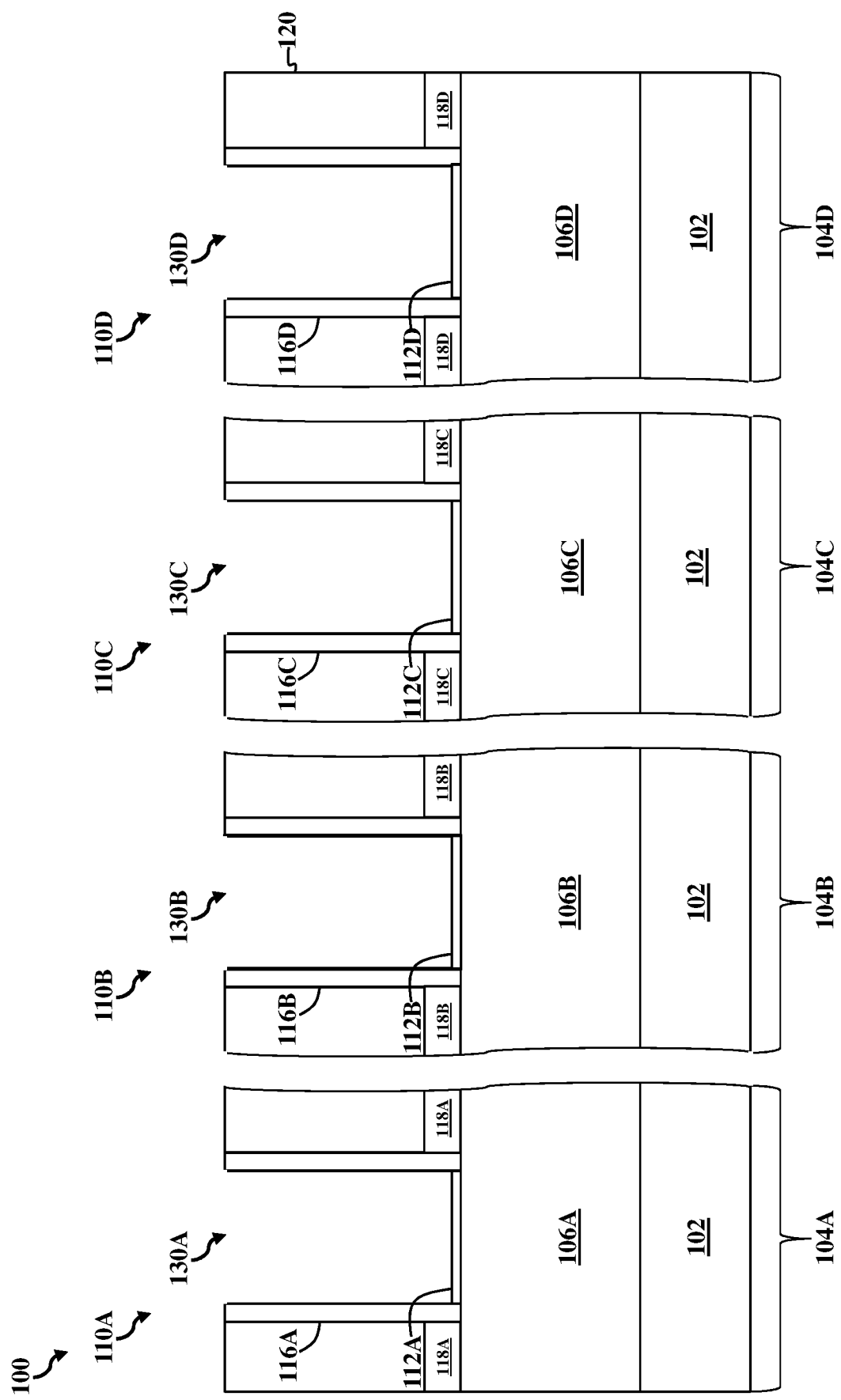

Turning to FIGS. 2B-2L, a gate replacement process is performed, where dummy gate stacks of gate structures 110A-110D are replaced with metal gate stacks. Turning to FIG. 2B, an etching process selectively removes dummy gate layers 114A-114D of gate structures 110A-110D, thereby forming an opening 130A in gate structure 110A, an opening 130B in gate structure 110B, an opening 130C in gate structure 110C, and an opening 130D in gate structure 110D. In the depicted embodiment, openings 130A-130D (also referred to as gate trenches) have sidewall surfaces defined respectively by spacers 116A-116D and bottom surfaces respectively defined by interfacial layers 112A-112D. In some implementations, where interfacial layers 112A-112D are omitted from gate structures 110A-110D, openings 130A-130D have bottom surfaces defined by fin structures 106A-106D. The etching process is a dry etching process, a wet etching process, or combinations thereof. The etching process can be tuned, such that dummy gate layers 114A-114D are removed without (or minimally) etching other features of fin-based integrated circuit device 100, such as ILD layer 120, spacers 116A-116D, interfacial layers 112A-112D, and/or fin structures 106A-106D.

Figure 2C:
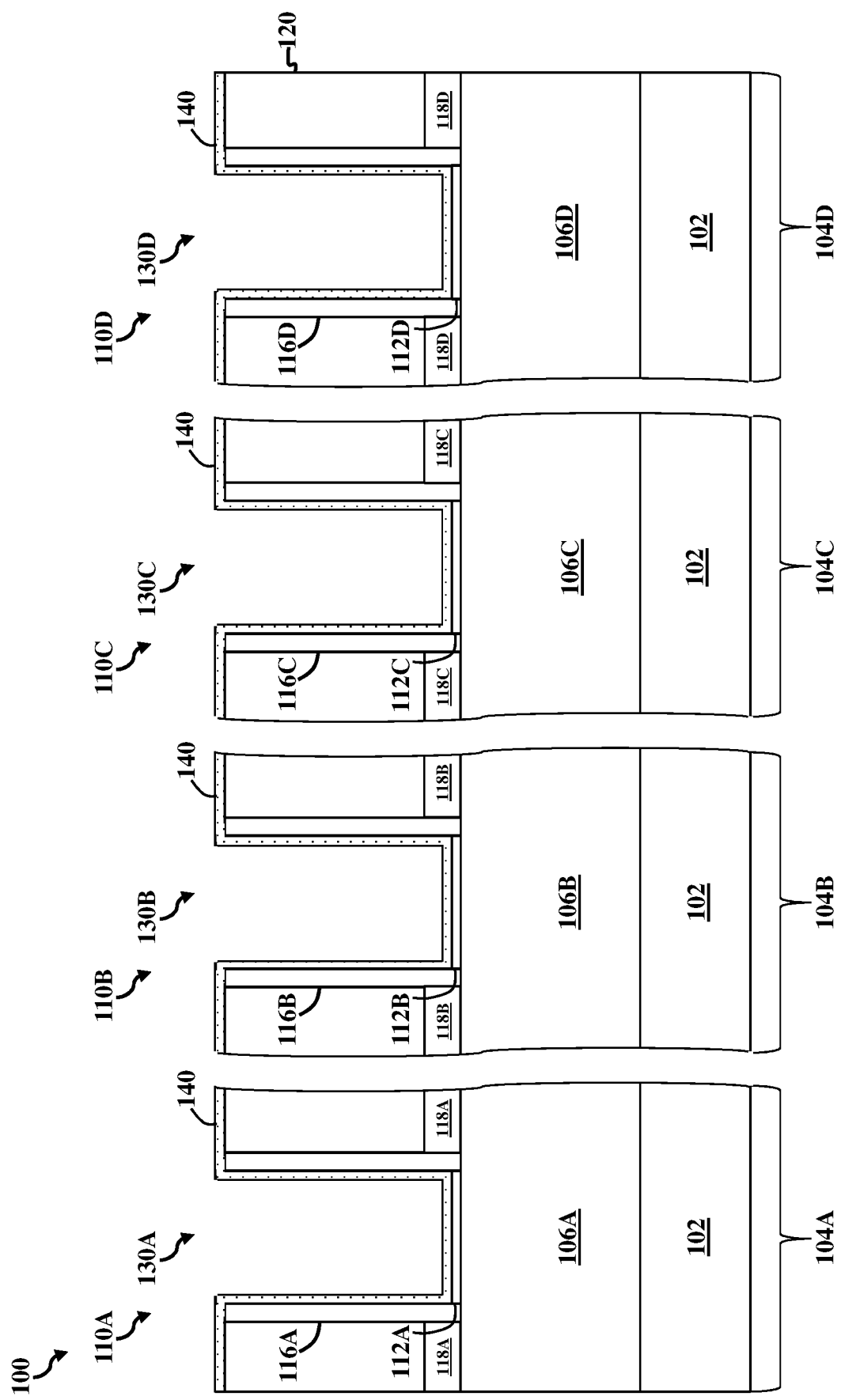

Turning to FIG. 2C, a gate dielectric layer 140 is formed over fin-based integrated circuit device 100. For example, an ALD process conformally deposits gate dielectric layer 140 over fin-based integrated circuit device 100, such that gate dielectric layer 140 has a substantially uniform thickness and partially fills openings 130A-130D. In the depicted embodiment, gate dielectric layer 140 is disposed on sidewall surfaces and bottom surfaces defining openings 130A-130D, such that gate dielectric layer 140 is disposed on interfacial layers 112A-112D and spacers 116A-116D. In some implementations, gate dielectric layer 140 has a thickness of about 5 Å to about 25 Å. In the depicted embodiment, gate dielectric layer 140 includes a high-k dielectric material (and thus may be referred to as a high-k dielectric layer), such as hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). In some implementations, gate dielectric layer 140 includes a dielectric material, such as silicon oxide or other suitable dielectric material. Alternatively, gate dielectric layer 140 is formed using another suitable deposition process, such as CVD, PVD, HDPCVD, MOCVD, RPCVD, PECVD, LPCVD, ALCVD, APCVD, spin coating, plating, other deposition process, or combinations thereof.

Figure 2D:
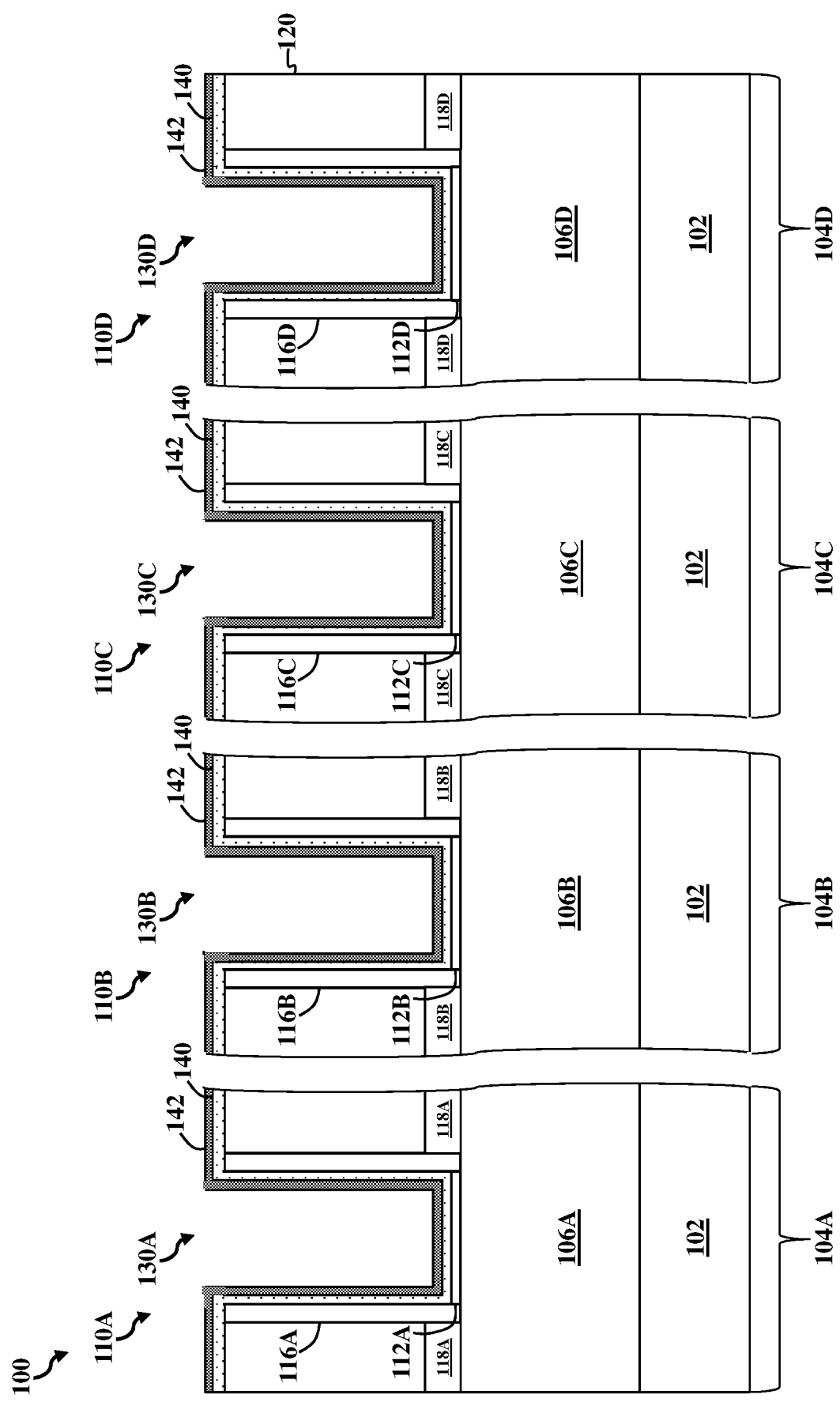

Turning to FIG. 2D, a capping layer 142 is formed over gate dielectric layer 140. For example, an ALD process conformally deposits capping layer 142 on gate dielectric layer 140, such that capping layer 142 has a substantially uniform thickness and partially fills openings 130A-130D. In some implementations, capping layer 142 has a thickness of about 5 Å to about 25 Å. Capping layer 142 includes a material that prevents or eliminates diffusion and/or reaction of constituents between gate dielectric layer 140 and other layers of gate structures 110A-110D (in particular, gate layers including metal). In some implementation, capping layer 142 includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. For example, in the depicted embodiment, capping layer 142 includes titanium and nitrogen (for example, TiN). Alternatively, capping layer 142 is formed using another suitable deposition process, such as CVD, PVD, HDPCVD, MOCVD, RPCVD, PECVD, LPCVD, ALCVD, APCVD, spin coating, plating, other deposition process, or combinations thereof.

Processing continues to form various layers for providing desired threshold voltages for LVTs in the low voltage regions, such as LV-N region 104B and LV-P region 104C, and for HVTs in the high voltage regions, such as HV-N region 104A and HV-P region 104D. Typically, lower threshold voltages are achieved in low voltage regions by increasing a thickness of a work function layer, such as a p-type work function layer and/or an n-type work function layer (described further below) in the low voltage regions relative to a thickness of the work function layer in high voltage regions, and/or introducing dopants into the work function layer (for example, using an ion implantation process) of the low voltage regions or the high voltage regions. However, as IC technology nodes shrink, particularly to 10 nm and beyond, openings formed during the gate replacement process also shrink, such that increasing a thickness of the work function layer to achieve lower threshold voltages negatively impacts gap filling. For example, increasing the thickness of the work function layer reduces dimensions of the openings for forming subsequent gate layers, such as metal fill layers, which can cause gaps and/or voids within resulting gate structures, degrading device performance. Furthermore, ion implantation processes are constrained by fin height and fin pitch associated with smaller technology nodes (as well as by a height of masking elements (for example, resist layers) used to cover nearby features during the ion implantation processes), such that a top portion of the work function layer has a greater dopant concentration than a bottom portion of the work function layer. Such phenomenon, which prevents uniform doping of the work function layer, is generally referred to as shadowing effects and can undesirably alter device performance. The present disclosure overcomes gap fill and/or shadowing effects issues by implementing a threshold voltage tuning layer that includes a material that has an aluminum blocking capability that decreases as a thickness of the threshold voltage tuning layer decreases, such that a threshold voltage decreases as the thickness of the threshold voltage tuning layer decreases. As described in detail below, gate structures in low voltage regions and high voltage regions thus include a threshold voltage tuning layer, where a thickness of the threshold voltage tuning layer in the low voltage regions is less than a thickness of the threshold voltage tuning layer in the high voltage regions.

Figure 2E:
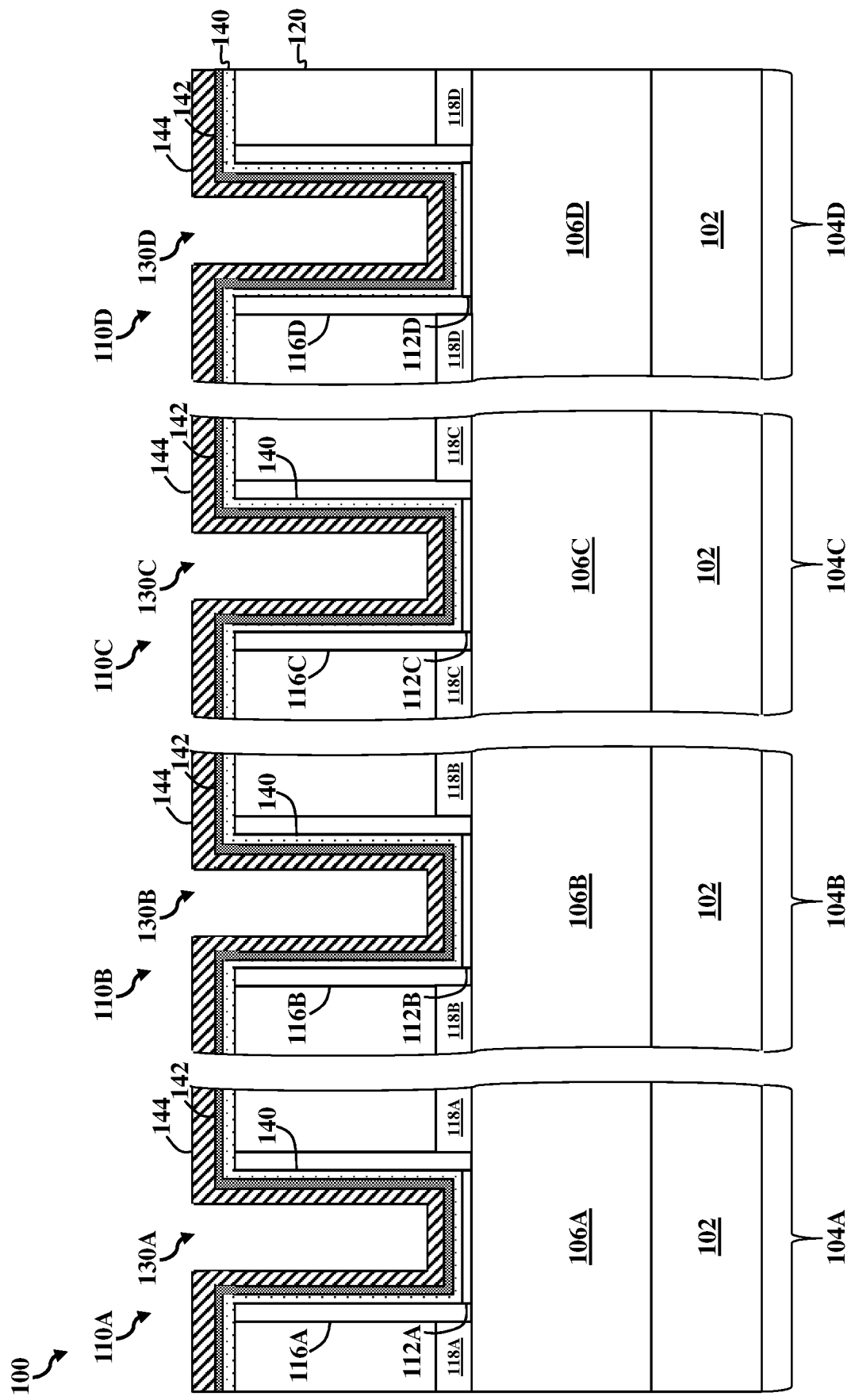

Turning to FIG. 2E, a threshold voltage tuning layer 144 is formed over capping layer 142. For example, an ALD process conformally deposits threshold voltage tuning layer 144 on capping layer 142, such that threshold voltage tuning layer 144 has a substantially uniform thickness and partially fills openings 130A-130D. In some implementations, threshold voltage tuning layer 144 has a thickness of about 10 Å to about 15 Å. In some implementations, the ALD process includes about twenty to about thirty ALD cycles. In some implementations, the ALD process is performed at a temperature of about 200° C. to about 300° C. Threshold voltage tuning layer 144 includes a material that has a work function value that is dependent on a thickness of threshold voltage tuning layer 144, where the work function value decreases as a thickness of the threshold voltage tuning layer 144 decreases. For example, threshold voltage tuning layer 144 includes a material that can block aluminum (for example, from a work function layer), preventing aluminum from penetrating into other gate layers of the gate stacks of gate structures 110A-110D. A capability of the material to block aluminum is dependent on a thickness of threshold voltage tuning layer 144, where aluminum blocking capability decreases as a thickness of threshold voltage tuning layer 144 decreases. Accordingly, as a thickness of threshold voltage tuning layer 144 decreases, aluminum blocking capability decreases, and work function of the corresponding device also decreases. Conversely, as a thickness of threshold voltage tuning layer 144 increases, aluminum blocking capability increases, and work function of the corresponding device also increases. Exemplary materials for threshold voltage tuning layer 144 include tantalum and nitrogen, such as TaN, TaSiN, TaCN, other tantalum-containing and nitrogen-containing material, or combinations thereof. In the depicted embodiment, threshold voltage tuning layer 144 includes TaN. In such implementations, the ALD process can implement a tantalum-containing precursor and a nitrogen-containing precursor. Further, alternatively, threshold voltage tuning layer 144 is formed using another suitable deposition process, such as CVD, PVD, HDPCVD, MOCVD, RPCVD, PECVD, LPCVD, ALCVD, APCVD, spin coating, plating, other deposition process, or combinations thereof.

Figure 2F:
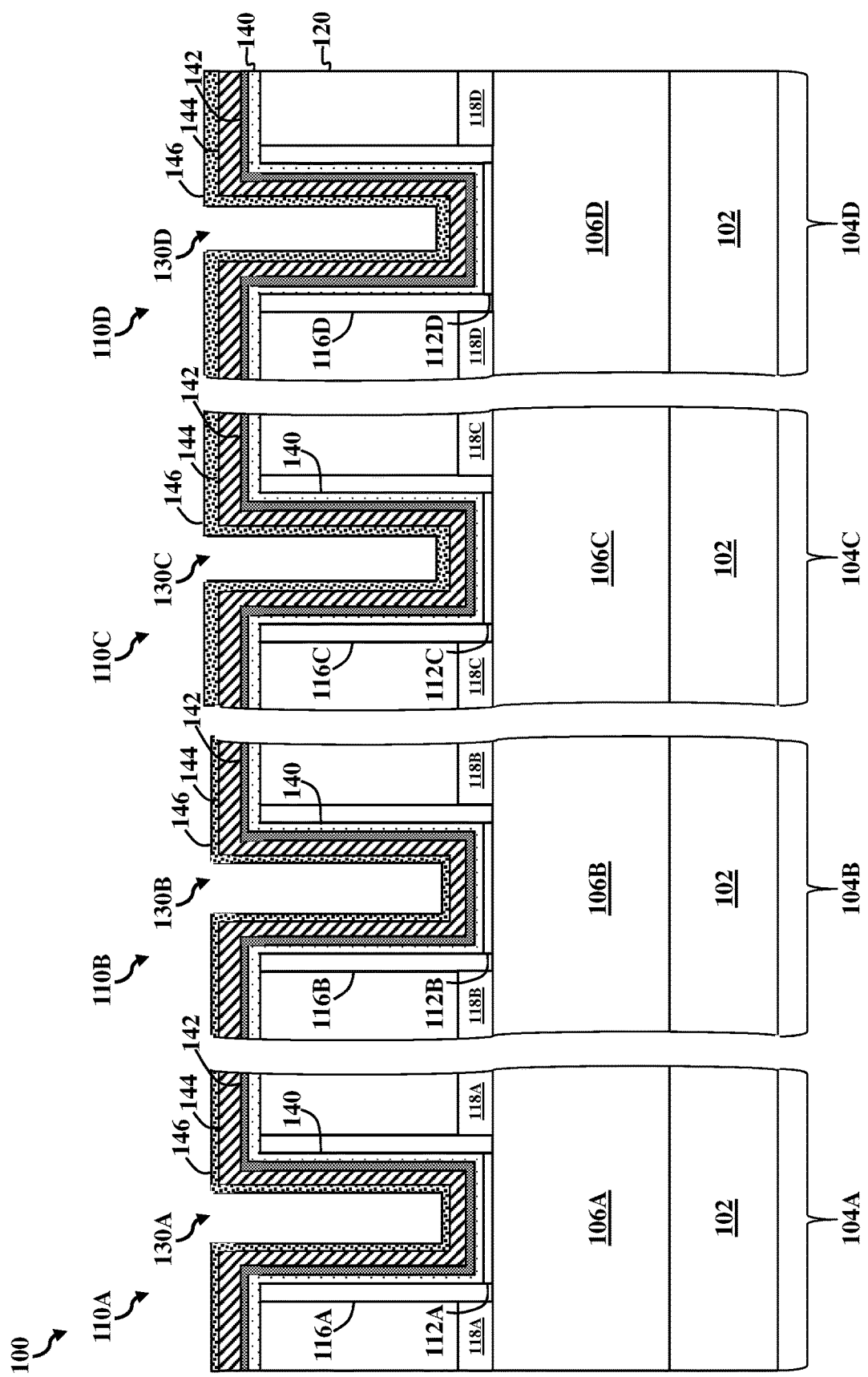

Turning to FIG. 2F, a p-type work function layer 146 is formed over threshold voltage tuning layer 144. For example, an ALD process conformally deposits p-type work function layer 146 on threshold voltage tuning layer 144, such that p-type work function layer 146 has a substantially uniform thickness and partially fills openings 130A-130D. In some implementations, p-type work function layer 146 has a thickness of about 10 Å to about 40 Å. In the depicted embodiment, a thickness of p-type work function layer 146 in n-type device regions (here, HV-N region 104A and LV-N region 104B) is less than a thickness of p-type work function layer 146 in p-type device regions (here, HV-P region 104D and LV-P region 104C). For example, a thickness of p-type work function layer 146 in HV-N region 104A and/or LV-N region 104B is about 10 Å to about 20 Å, while a thickness of p-type work function layer 146 in HV-P region 104D and/or LV-P region 104C is about 20 Å to about 40 Å. In some implementations, the ALD process includes about twenty to about fifty ALD cycles. In some implementations, the ALD process is performed at a temperature of about 400°

C. to about 450° C. (which is greater than the temperature implemented by the ALD process for forming threshold voltage tuning layer 144). P-type work function layer 146 includes any suitable p-type work function material, such as TiN, TaN, Ru, Mo, Al, WN, ZrSi$_2$, MoSi$_2$, TaSi$_2$, NiSi$_2$, WN, other p-type work function material, or combinations thereof. In the depicted embodiment, p-type work function layer 146 includes titanium and nitrogen, such as TiN. Alternatively, p-type work function layer 146 is formed using another suitable deposition process, such as CVD, PVD, HDPCVD, MOCVD, RPCVD, PECVD, LPCVD, ALCVD, APCVD, spin coating, plating, other deposition process, or combinations thereof.

Figure 2G:
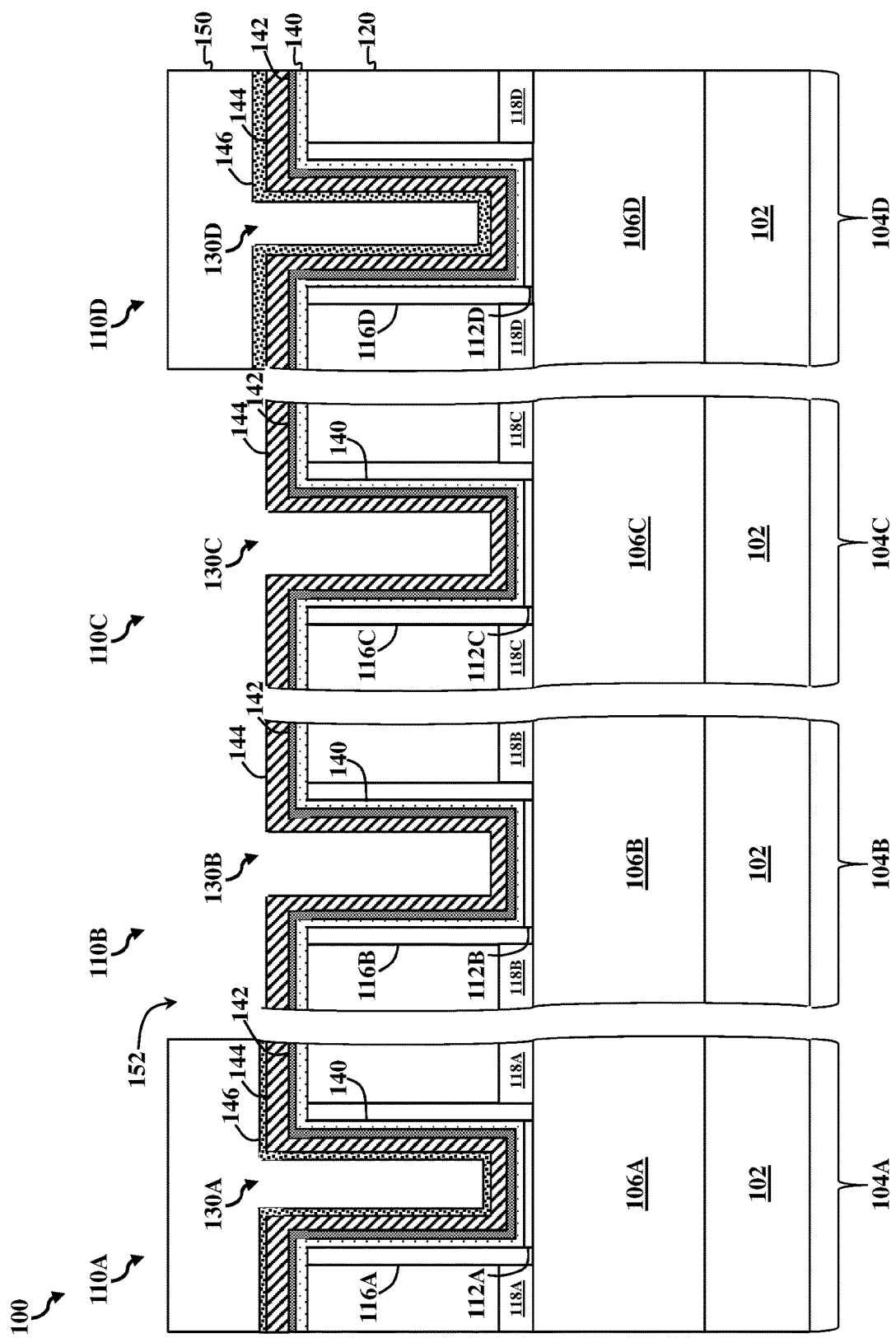

Turning to FIG. 2G, p-type work function layer 146 is removed from low voltage regions of fin-based integrated circuit device 100, such as LV-N region 104B and LV-P region 104C. For example, a patterned masking layer 150 is formed over fin-based integrated circuit device 100. Patterned masking layer 150 has one or more openings 152 that expose LV-N region 104B and LV-P region 104C, particularly exposing p-type work function layer 146 in LV-N region 104B and LV-P region 104C. Patterned masking layer 150 is formed by any suitable process, including the deposition processes, lithography processes, and/or etching process described herein. In some implementations, patterned masking layer 150 includes a material having a different etching characteristic than p-type work function layer 146 and/or threshold voltage tuning layer 144. For example, patterned masking layer 150 includes silicon, amorphous silicon, semiconductor oxide (for example, silicon oxide (SiO$_2$)), semiconductor nitride (for example, silicon nitride (SiN)), semiconductor oxynitride (for example, silicon oxynitride (SiON)), and/or semiconductor carbide (for example, silicon carbide (SiC)), other semiconductor material, and/or other dielectric material. In some implementations, patterned masking layer 150 includes a resist material (and thus may be referred to as a patterned resist layer and/or a patterned photoresist layer). Any suitable process is then used to remove p-type work function layer 146 from low voltage regions, thereby exposing threshold voltage tuning layer 144 in LV-N region 104B and LV-P region 104C as depicted. For example, a wet etching process removes p-type work function layer 146 using an etching solution that includes ammonium hydroxide (NH$_4$OH), hydrogen peroxide (H$_2$O$_2$), sulfuric acid (H$_2$SO$_4$), tetramethylammonium hydroxide (TMAH), hydrogen chloride (HCl), other suitable wet etching solution, or combinations thereof. For example, the wet etching solution utilizes an NH$_4$OH:H$_2$O$_2$ solution, an HCl:H$_2$O$_2$:H$_2$O solution (known as an hydrochloric-peroxide mixture (HPM)), an NH$_4$OH:H$_2$O$_2$:H$_2$O solution (known as an ammonia-peroxide mixture (APM)), or an H$_2$SO$_4$:H$_2$O$_2$ solution (known as a sulfuric peroxide mixture (SPM)). In the depicted embodiment, p-type work function layer 146 is removed by a wet etching process that implements an HPM.

Figure 2H:
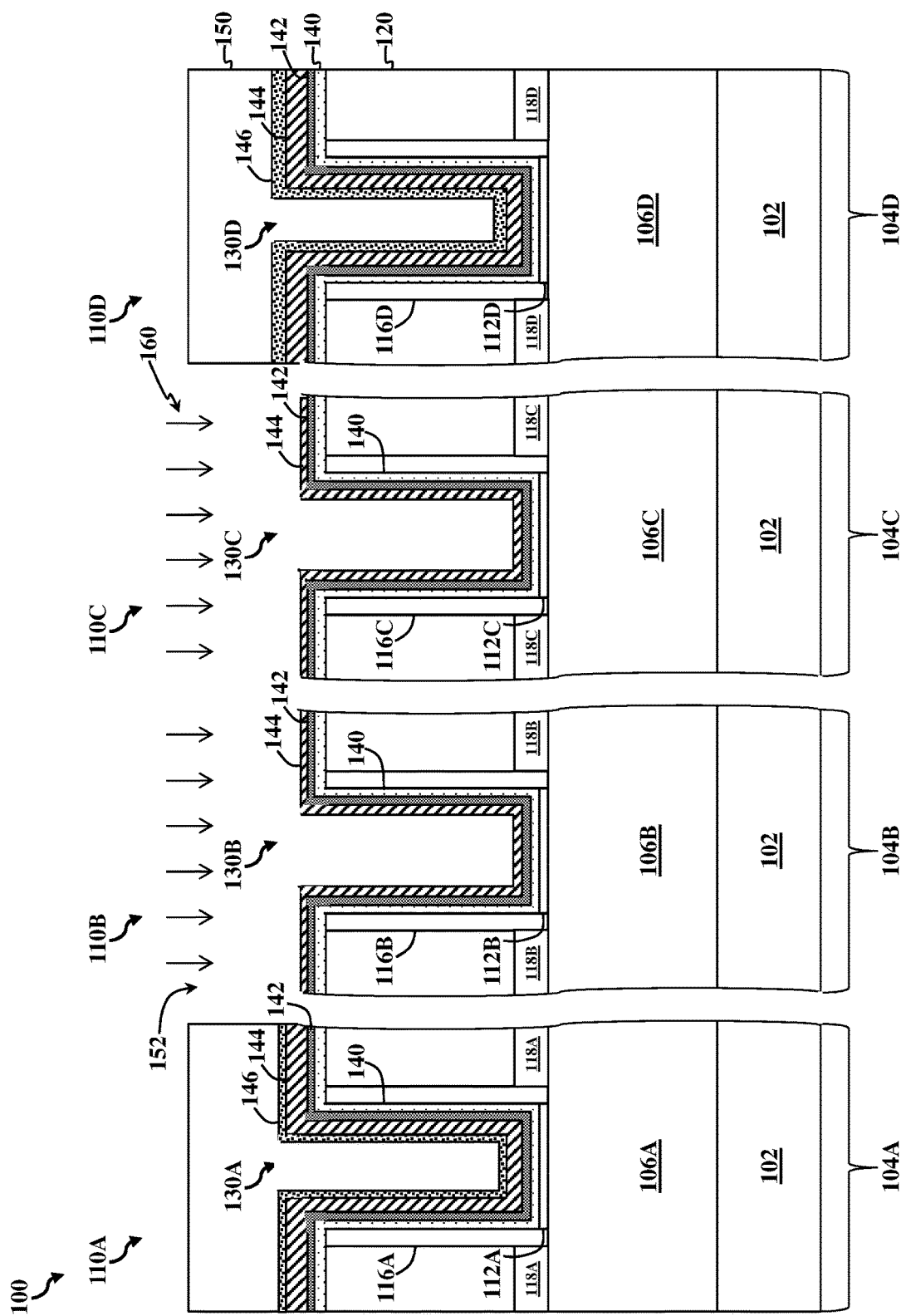

Turning to FIG. 2H, a threshold voltage tuning treatment 160 is performed on threshold voltage tuning layer 144 in low voltage regions of fin-based integrated circuit device 100, thereby lowering a threshold voltage of LVTs in LV-N region 104B and LV-P region 104C. Threshold voltage tuning treatment 160 etches back threshold voltage tuning layer 144 in LV-N region 104B and LV-P region 104C using a chloride-containing precursor. For example, in the depicted embodiment, threshold voltage tuning treatment 160 etches back threshold voltage tuning layer 144 in LV-N region 104B and LV-P region 104C using a tungsten-chloride containing precursor, such as tungsten pentachloride (WCl$_5$). Reducing a thickness of threshold voltage tuning layer 144 in LV-N region 104B and LV-P region 104C reduces an aluminum blocking capability of threshold voltage tuning layer 144 in LV-N region 104B and LV-P region 104C, which increases penetration of aluminum from gate layers overlying threshold voltage tuning layer 144 into gate layers underlying threshold voltage tuning layer 144, thereby reducing a threshold voltage of LVTs in LV-N region 104B and LV-P region 104C. It has been observed that adjusting a remaining thickness of the threshold voltage tuning layer 144 can reduce a threshold voltage of low voltage regions, such as LV-N region 104B and LV-P region 104C, relative to high voltage regions, such as HV-N region 104A and HV-N region 104D, as much as 120 mV. In the depicted embodiment, after threshold voltage tuning treatment 160, threshold voltage tuning layer 144 in LV-N region 104B and/or LV-P region 104C has a thickness less than or equal to about 15 Å. In some implementations, threshold voltage tuning layer 144 in LV-N region 104B and/or LV-P region 104C is completely removed depending on threshold voltage requirements of LV-N region 104B and/or LV-P region 104C. Various etching parameters can be tuned to achieve desired threshold voltage tuning (by tuning a thickness of threshold voltage tuning layer 144 in low voltage regions relative to a thickness of threshold voltage tuning layer 144 in high voltage regions), such as etchant composition, etching temperature, etching solution concentration, etching time, etching pressure, source power, RF bias voltage, RF bias power, etchant flow rate, other suitable etching parameters, or combinations thereof. In some implementations, threshold voltage tuning treatment 160 implements an etching temperature of about 400° C. to about 500° C. In some implementations, threshold voltage tuning treatment 160 implements an etching pressure of about 20 torr to about 30 torr. In some implementations, threshold voltage tuning treatment 160 is performed for less than or equal to about 100 seconds. Thereafter, patterned masking layer 150 is removed by any suitable process.

In some implementations, during processing, surfaces of threshold voltage tuning layer 144 may be oxidized when exposed to oxygen ambient, such that threshold voltage tuning layer 144 has an oxidized surface (layer) that includes tantalum and oxygen (for example, TaO). In some implementations, threshold voltage tuning treatment 160 uses the tungsten-chloride containing precursor, such as WC's, to both remove the oxidized surface in LV-N region 104B and LV-P region 104C and etch back threshold voltage tuning layer 144 in LV-N region 104B and LV-P region 104C. In some implementations, threshold voltage tuning treatment 160 uses a tantalum-chloride containing precursor, such as tantalum pentachloride (TaCl$_5$), to remove the oxidized surface in LV-N region 104B and LV-P region 104C, and then uses the tungsten-chloride containing precursor, such as WC's, to etch back threshold voltage tuning layer 144 in LV-N region 104B and LV-P region 104C. In some implementations, threshold voltage tuning treatment 160 uses only tantalum-chloride containing precursor, such as TaCl$_5$, to remove only the oxidized surface, such that threshold voltage tuning layer 144 in LV-N region 104B and LV-P region 104C do have an oxidized surface (layer), while threshold voltage tuning layer 144 in HV-N region 104A and HV-P region 104D have an oxidized surface (layer).

Figure 2I:
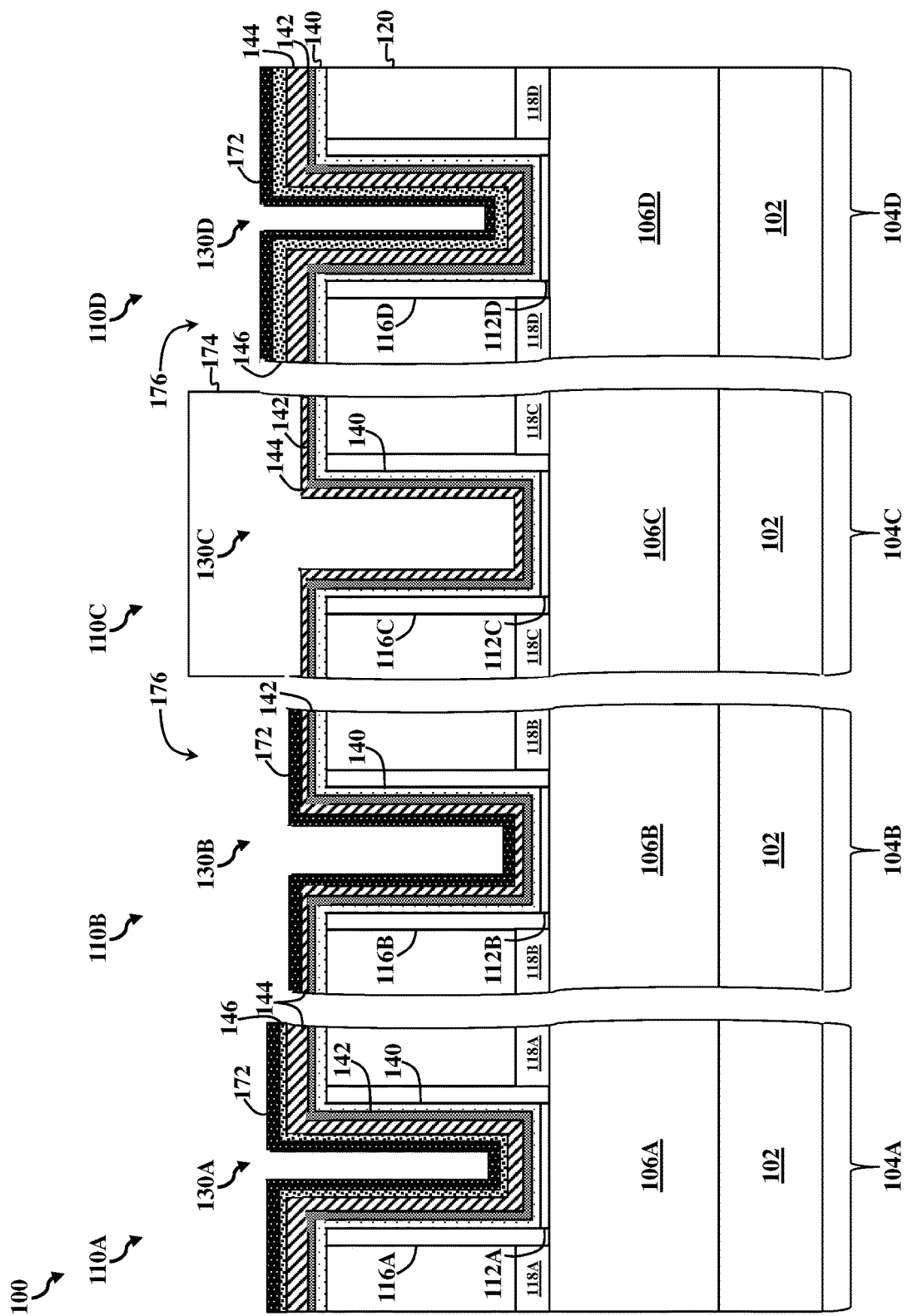

Turning to FIG. 2I, an n-type work function layer 172 is formed over fin-based integrated circuit device 100. In the depicted embodiment, n-type work function layer 172 is not formed in every region of fin-based integrated circuit device 100. For example, a patterned masking layer 174 is formed over fin-based integrated circuit device 100, such that patterned masking layer 174 covers LV-P region 104C and exposes HV-N region 104A, LV-N region 104B, and HV-P region 104D. In particular, patterned masking layer 174 has one or more openings 176 that expose p-type work function layer 146 in HV-N region 104A and HV-P region 104D and threshold voltage tuning layer 144 in LV-N region 104B. Patterned masking layer 174 is formed by any suitable process, including the deposition processes, lithography processes, and/or etching process described herein. In some implementations, patterned masking layer 174 includes any suitable masking material, such as silicon, amorphous silicon, semiconductor oxide (for example, $SiO_2$), semiconductor nitride (for example, SiN), semiconductor oxynitride (for example, SiON), and/or semiconductor carbide (for example, SiC), other semiconductor material, and/or other dielectric material. In some implementations, patterned masking layer 174 includes a resist material. In furtherance of the example, an ALD process then conformally deposits n-type work function layer 172 over p-type work function layer 146 and/or threshold voltage tuning layer 144, such that n-type work function layer 172 has a substantially uniform thickness and partially fills opening 130A, opening 130B, and opening 130D. In the depicted embodiment, n-type work function layer 172 is thus disposed on n-type work function layer 146 in HV-N region 104A and HV-P region 104D and disposed on threshold voltage tuning layer 144 in LV-N region 104B. In some implementations, n-type work function layer 172 has a thickness of about 25 Å to about 45 Å. N-type work function layer 172 includes any suitable n-type work function material, such as Ti, Al, Ag, Mn, Zr, TiAl, TiAlC, TaC, TaCN, TaSiN, TaAl, TaAlC, TiAlN, other n-type work function material, or combinations thereof. In the depicted embodiment, n-type work function layer 172 includes titanium and aluminum, such as TaAlC, TaAl, TiAlC, TiAl, TaSiAl, TiSiAl, TaAlN, or TiAlN. Alternatively, n-type work function layer 172 is formed using another suitable deposition process, such as CVD, PVD, HDPCVD, MOCVD, RPCVD, PECVD, LPCVD, ALCVD, APCVD, spin coating, plating, other deposition process, or combinations thereof.

Figure 2J:
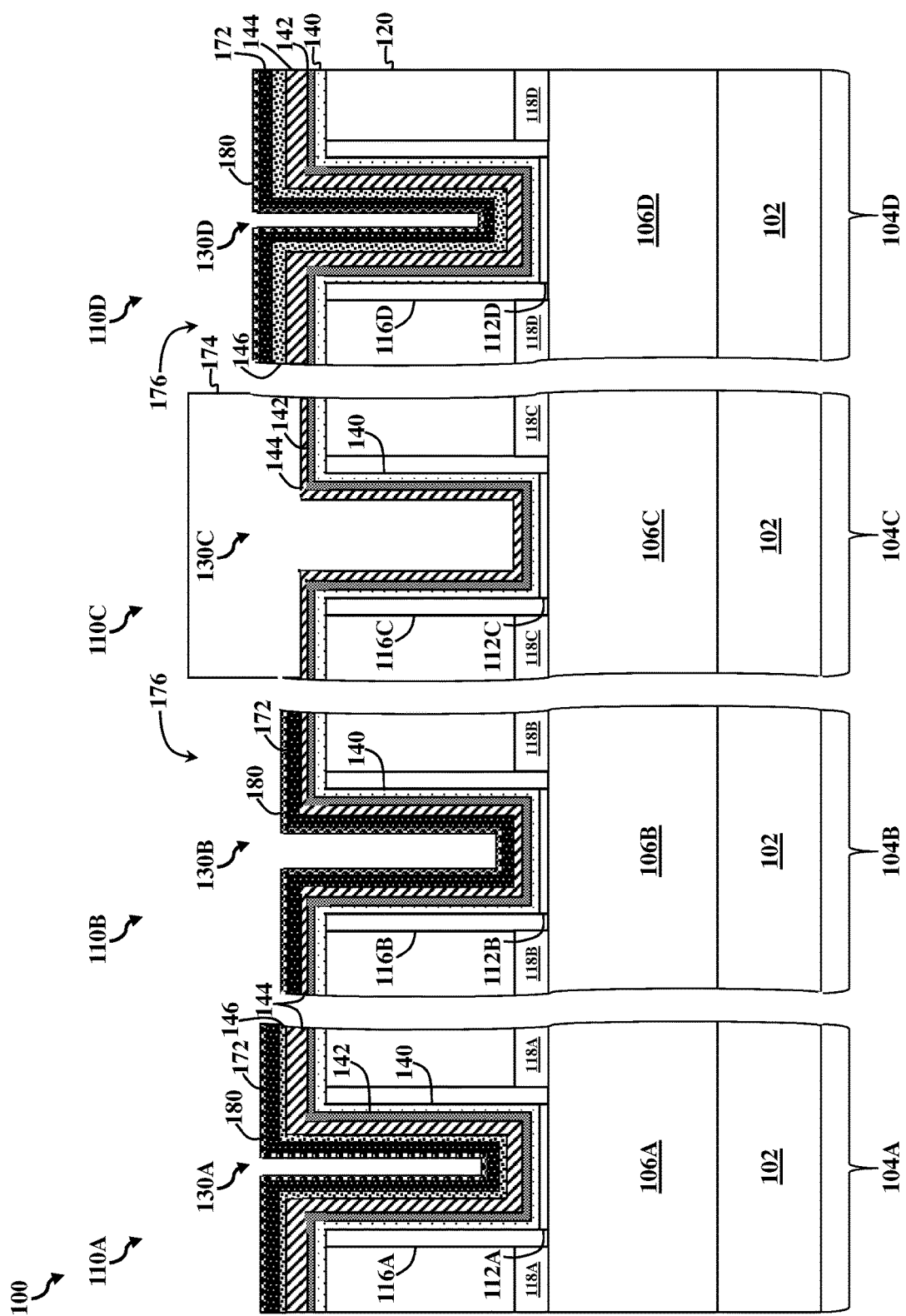

Turning to FIG. 2J, a glue layer 180 is formed over fin-based integrated circuit device 100. In the depicted embodiment, glue layer 180 is not formed in every region of fin-based integrated circuit device 100. For example, patterned masking layer 174 remains over LV-P region 104B, exposing n-type work function layer 172 in HV-N region 104A, LV-N region 104B, and HV-P region 104D. Glue layer 180 is thus formed in HV-N region 104A, LV-N region 104B, and HV-P region 104D. For example, an ALD process conformally deposits glue layer 180 on n-type work function layer 172, such that glue layer 180 has a substantially uniform thickness and partially fills opening 130A, opening 130B, and opening 130D. Thereafter, patterned masking layer 174 is removed by any suitable process. In some implementations, glue layer 180 has a thickness of about 10 Å to about 15 Å. Glue layer 180 includes a material that promotes adhesion between adjacent layers, such as n-type work function layer 172 and subsequently formed layers of gate structures 110A-110D (for example, metal fill layers). For example, glue layer 180 includes metal (for example, W, Al, Ta, Ti, Ni, Cu, Co, other suitable metal, or combinations thereof), metal oxides, metal nitrides, or combinations thereof. In the depicted embodiment, glue layer 180 includes titanium and nitrogen, such as TiN. Alternatively, glue layer 180 is formed using another suitable deposition process, such as CVD, PVD, HDPCVD, MOCVD, RPCVD, PECVD, LPCVD, ALCVD, APCVD, spin coating, plating, other deposition process, or combinations thereof.

Figure 2K:
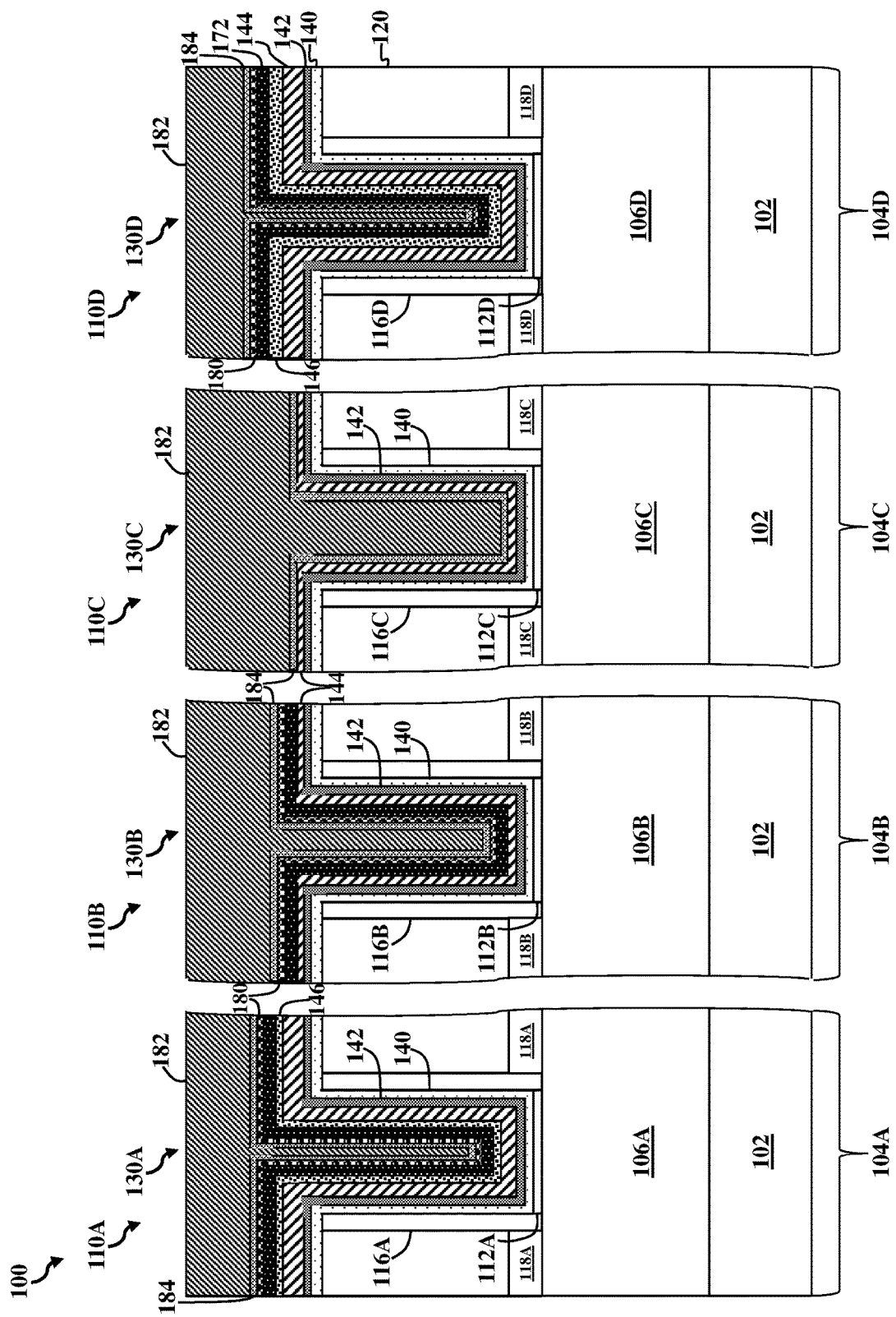

Turning to FIG. 2K, a metal fill (or bulk) layer 182 is formed over fin-based integrated circuit device 100. For example, an ALD process conformally deposits metal fill layer 182 on glue layer 180 (in HV-N region 104A, LV-N region 104B, and HV-P region 104D) and threshold voltage tuning layer 144 (in LV-P region 104C), such that metal fill layer 182 has a substantially uniform thickness and fills openings 130A-130D. In some implementations, metal fill layer 182 has a thickness of about 1,500 Å to about 3,000 Å. Metal fill layer 182 includes a suitable conductive material, such as Al, W, and/or Cu. In the depicted embodiment, metal fill layer 182 includes W. Metal fill layer 182 may additionally or collectively include other metals, metal oxides, metal nitrides, other suitable materials, or combinations thereof. In some implementations, a blocking layer 184 is optionally formed over fin-based integrated circuit device 100 before forming metal fill layer 182, such that metal fill layer 182 is disposed on blocking layer 184. For example, an ALD process conformally deposits blocking layer 184 on glue layer 180 and threshold voltage tuning layer 144, such that blocking layer 184 has a substantially uniform thickness and partially fills openings 130A-130D. In some implementations, blocking layer 184 has a thickness of about 25 Å to about 35 Å. Blocking layer 184 includes a material that blocks and/or reduces diffusion between gate layers, such as metal fill layer 182 and n-type work function layer 172 and/or p-type work function layer 146. In the depicted embodiment, blocking layer 184 includes titanium and nitrogen, such as TiN. Alternatively, metal fill layer 182 and/or blocking layer 184 are formed using another suitable deposition process, such as CVD, PVD, HDPCVD, MOCVD, RPCVD, PECVD, LPCVD, ALCVD, APCVD, spin coating, plating, other deposition process, or combinations thereof.

Figure 2L:
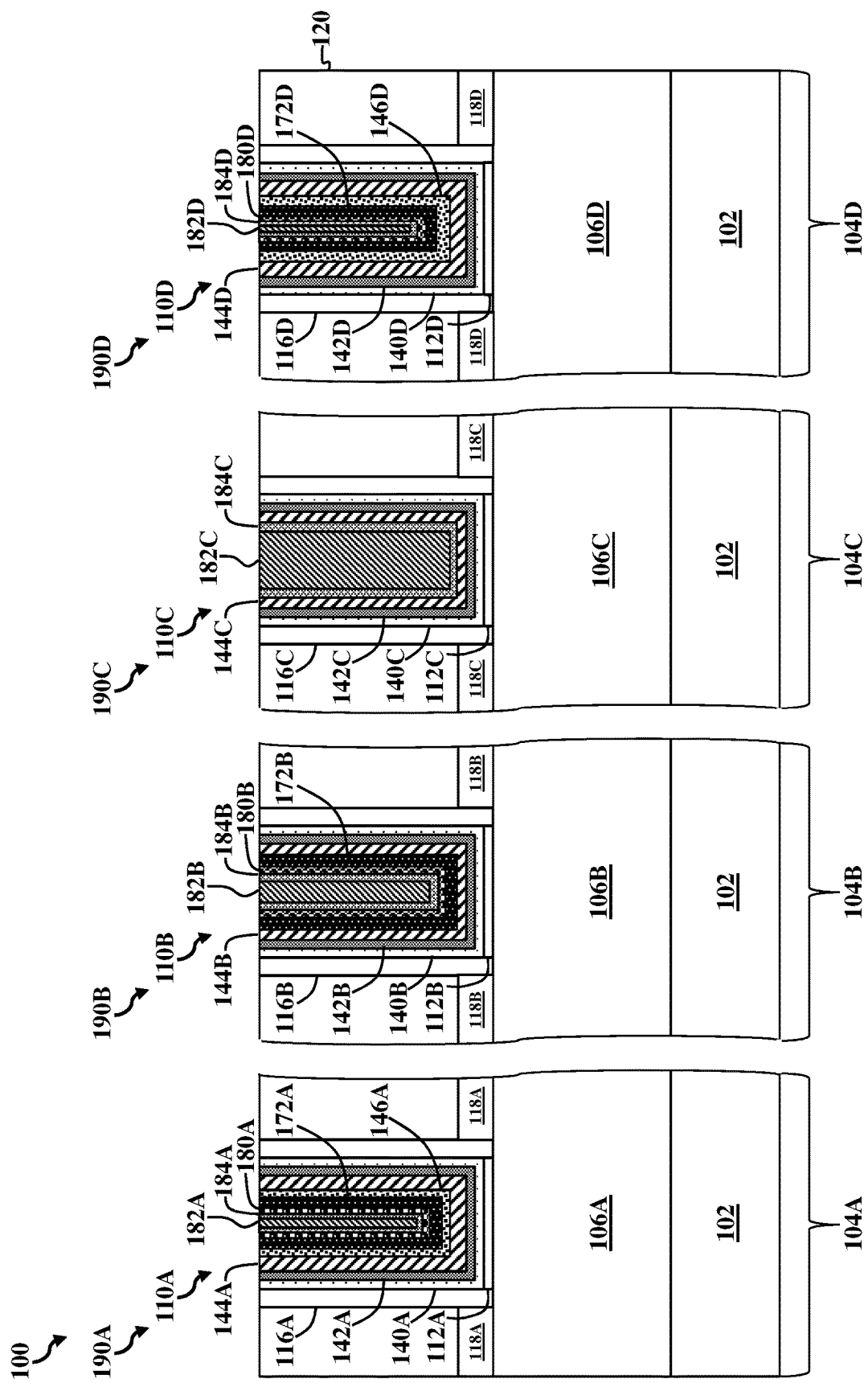

Turning to FIG. 2L, a planarization process is performed to remove excess gate materials from fin-based integrated circuit device 100, such that gate structures 110A-110D include metal gate stacks. For example, a CMP process is performed until a top surface of ILD layer 120 is reached (exposed). In the depicted embodiment, top surfaces of gate structures 110A-110D are substantially planar with a top surface of ILD layer 120 after the CMP process. Accordingly, an n-type FinFET 190A including gate structure 110A is disposed in HV-N region 104A, an n-type FinFET 190B including gate structure 110B is disposed in LV-N region 104B, a p-type FinFET 190C including gate structure 110C is disposed in LV-P region 104C, and a p-type FinFET 190D including gate structure 110D is disposed in HV-P region 104D. As configured, n-type FinFET 190A and p-type FinFET 190B are high voltage FinFETs, and n-type FinFET 190B and p-type FinFET 190C are low voltage FinFETs, such that n-type FinFET 190A and p-type FinFET 190B have greater threshold (operating) voltages than n-type FinFET 190B and p-type FinFET 190C. Gate structure 110A includes interfacial layer 112A, a gate dielectric layer 140A, a capping layer 142A, a threshold voltage tuning layer 144A, a p-type work function layer 146A, an n-type work function layer 172A, a glue layer 180A, a blocking layer 184A, and a metal fill layer 182A. Gate structure 110B includes interfacial layer 112B, a gate dielectric layer 140B, a capping layer 142B, a threshold voltage tuning layer 144B, an n-type work function layer 172B, a glue layer 180B, a blocking layer 184B, and a metal fill layer 182B. Gate structure 110C includes interfacial layer 112C, a gate dielectric layer 140C, a capping layer 142C, a threshold voltage tuning layer 144C, a blocking layer 184C, and a metal fill layer 182C. Gate structure 110D includes interfacial layer 112D, a gate dielectric layer 140D, a capping layer 142D, a threshold voltage tuning layer 144D, a p-type work function layer 146D, an n-type work function layer 172D, a glue layer 180D, a blocking layer 184D, and a metal fill layer 182D. A thickness of p-type work function layer 146D is greater than a thickness of p-type work function layer 146A. A thickness of threshold voltage tuning layer 144A and/or threshold voltage tuning layer 144D is greater than a thickness of threshold voltage tuning layer 144B and/or threshold voltage tuning layer 144C. High voltage FinFETs thus have threshold voltage tuning layers (here, threshold voltage tuning layers 144A, 144D) that exhibit better aluminum blocking capability than threshold voltage tuning layers of low voltage FinFETs (here, threshold voltage tuning layers 144B, 144C), where aluminum from other gate layers (here, n-type work function layers 172A, 172D) is prevented from penetrating other gate layers (such as interfacial layers 112A, 112D; gate dielectric layers 140A, 140D; and/or capping layers 142A, 142D), such that high voltage FinFETs exhibit greater threshold voltages than the low voltage FinFETs. Multiple threshold voltage devices are thus achieved by altering an aluminum blocking capability of a threshold voltage tuning layer. Different embodiments may have different advantages, and no particular advantage is necessarily required of any embodiment.

Fabrication can proceed to complete fabrication of fin-based integrated circuit device 100. For example, various contacts can be formed to facilitate operation of FinFET devices 190A-190D. For example, one or more ILD layers, similar to ILD layer 120, can be formed over substrate 102 (in particular, over ILD layer 120 and gate structures 110A-110D). Contacts can then be formed in ILD layer 120 and/or ILD layers disposed over ILD layer 120. For example, contacts are respectively electrically coupled with gate structures 110A-110D of FinFETs 190A-190D (particularly, gate electrodes of gate structures 110A-110D), and contacts are respectively electrically coupled to source/drain regions of FinFETs 190A-190C (particularly, epitaxial source/drain features 118A-118D). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 120 and the contacts (for example, extending through ILD layer 120 and/or the other ILD layers) are a portion of an MLI feature disposed over substrate 102, as described above. The MLI feature can include a combination of metal layers and ILD layers configured to form vertical interconnect features, such as contacts and/or vias, and/or horizontal interconnect features, such as lines. The various conductive features include materials similar to the contacts. In some implementations, a damascene process and/or dual damascene process is used to form the MLI feature.

Sometimes, during processing, one or more of the gate layers of gate structures 110A-110D may be altered when exposed to external ambient as fin-based integrated circuit device 100 is transferred between processing systems for processing. For example, surfaces of one or more of the gate layers of gate structures 110A-110D may be oxidized when exposed to oxygen ambient, undesirably altering the threshold voltages corresponding with gate structures 110A-110D. To minimize such occurrences, in some implementations, one or more of the gate layers of gate structures 110A-110D can be processed "in-situ," which generally refers to performing various processes on fin-based integrated circuit device 100 within the same IC processing system or IC processing tool, allowing fin-based integrated circuit device 100 to remain under vacuum conditions during the various processes. As such, "in-situ" also generally refers to performing various processes on fin-based integrated circuit device 100 without exposing fin-based integrated circuit device 100 to an external ambient (for example, external to an IC processing system), such as oxygen. In some implementations, threshold voltage tuning treatment 160, formation of n-type work function layer 172, formation of glue layer 180, and/or formation of blocking layer 184 are performed in-situ, thereby minimizing (or eliminating) exposure to oxygen and/or other external ambient during processing.

Figure 3:
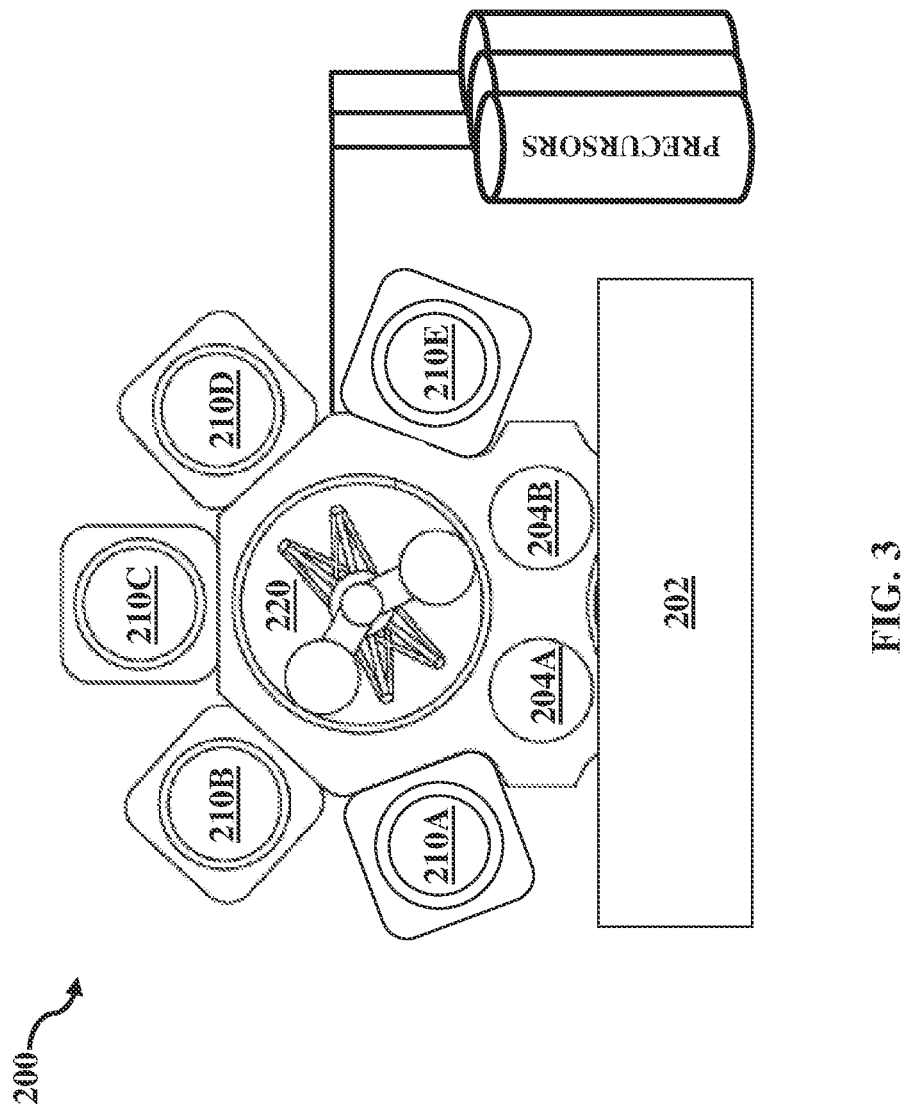
FIG. 3 is a fragmentary diagrammatic view of a multi-chamber integrated circuit processing system according to various aspects of the present disclosure.

FIG. 3 is a fragmentary diagrammatic view of a multi-chamber integrated circuit (IC) processing system 200 according to various aspects of the present disclosure. In some implementations, multi-chamber IC processing system 200 is referred to as an IC cluster tool. Multi-chamber IC processing system 200 includes a load port 202, one or more load lock chambers (for example, a load lock chamber 204A and a load lock chamber 204B), one or more processing chambers (for example, a processing chamber 210A, a processing chamber 210B, a processing chamber 210C, a processing chamber 210D, and a processing chamber 210E), and a wafer handling chamber 220. Wafers are moved among processing chambers 210A-210E to process various gate layers in an in-situ manner, such that the wafers remain under vacuum conditions during processing in multi-chamber IC processing system 200. In some implementations, various gate replacement processes are performed on fin-based integrated circuit device 100 in multi-chamber IC processing system 100, such that fin-based integrated circuit device 100 remains under vacuum conditions during the various gate replacement processes. FIG. 3 has been simplified for the sake of clarity to better understand the inventive concepts of the present disclosure. Additional features can be added in multi-chamber IC processing system 200, and some of the features described below can be replaced, modified, or eliminated in other embodiments of multi-chamber IC processing system 200.

Load lock chambers 204A, 204B are configured to receive a wafer (for example, having fin-based integrated circuit device 100 fabricated thereon) transferred from load port 202. Load lock chambers 204A, 204B are configured to facilitate transfer of wafers in and out of multi-chamber IC processing system 200. In some implementations, multi-chamber IC processing system 200 is under vacuum, and load lock chamber 204A, 204B can "pump down" an environment of wafers introduced into multi-chamber IC processing system 200 (for example, using a mechanical pump and/or a turbomolecular pump), such that the environment of the wafers is under vacuum. In some implementations, load lock chambers 204A, 204B are configured to receive a single wafer or a plurality of wafers (for example, wafers loaded into a wafer cassette, pod, or carrier). In some implementations, load lock chambers 204A, 204B are separated from wafer handling chamber 220 by a gate valve, allowing wafer handling chamber 220 to remain under vacuum when load lock chamber 204A and/or load lock chamber 204B are vented during operation. Wafer handling chamber 220 includes an automated, robotic arm that can transfer wafers along any of a horizontal, vertical, and/or rotational axis between load lock chamber 204A, load lock chamber 204B and/or any of processing chambers 210A-210E. Processing chamber 210A-210E are configured to perform a number of IC processing operations, such as ALD, CVD, PVD, etching, pre-treatment/pre-soak, de-gassing, annealing, as well as a number of metrology operations such as XPS analysis, AFM analysis, and/or other suitable processing or metrology operations. Wafers can thus remain under vacuum while processed within multi-chamber IC processing system 100, such that the wafers are not (or minimally) exposed to external ambient, such as oxygen, during gate formation processing. The present disclosure contemplates that multi-chamber IC processing system 200 can include more or less load lock chambers, processing chambers, wafer handling chambers, and/or other chambers depending on IC processing requirements.

In some implementations, processing chamber 210A is configured for performing a threshold voltage tuning treatment, such as threshold voltage tuning treatment 160; processing chamber 210B, processing chamber 210C, and/or processing chamber 210D are configured to perform an ALD process to form an n-type work function layer, such as n-type work function layer 172; and processing chamber 210E is configured to perform an ALD process to form a glue layer, such as glue layer 180, and/or a blocking layer, such as blocking layer 184. For example, processing chamber 210A is configured to receive one or more precursors for reducing a thickness of a threshold voltage tuning layer including tantalum and nitrogen, such as threshold voltage tuning layer 144 in the depicted embodiment; processing chamber 210B, processing chamber 210C, and/or processing chamber 210D are configured to receive one or more precursors suitable for forming an n-type work function layer that includes titanium and aluminum; and processing chamber 210E is configured to receive one or more precursors suitable for forming a glue layer and/or a blocking layer that includes titanium and nitrogen. In some implementations, processing chamber 210A is configured to receive a tungsten-chloride containing precursor, such as WC's; processing chamber 210B, processing chamber 210C, and/or processing chamber 210D are configured to receive an aluminum-containing precursor, such as dimethylaluminumhydride (DMAH) or dimethylethylaminealane (DMEAA); and processing chamber 210E is configured to receive a titanium-containing precursor, such as titanium tetrachloride ($TiCl_4$), and a nitrogen-containing precursor, such as ammonia ($NH_3$). In some implementations, processing chamber 210A is configured to maintain a temperature of about 400° C. to about 500° C. In some implementations, processing chamber 210A is configured to maintain a pressure of about 20 torr to about 30 torr. The present disclosure contemplates implementations where processing chambers 210A-210E are configured to perform other gate replacement processes, such as forming a gate dielectric layer (for example, high-k dielectric layer 140), forming a capping layer (for example, capping layer 142), forming a threshold voltage tuning layer (for example, threshold voltage tuning layer 144), forming a p-type work function layer (for example, p-type work function layer 146), treating one or more of the gate layers, and/or any other gate replacement process that can benefit from in-situ processing. In implementations where one of processing chambers 210A-210E is configured for forming a threshold voltage tuning layer that includes tantalum and nitrogen, the processing chamber can be configured to receive a tantalum-containing precursor, such as pentakis-dimethylamino tantalum (PDMAT), and a nitrogen-containing precursor, such as $NH_3$.

The present disclosure provides for many different embodiments. Methods for tuning threshold voltages of fin-like field effect transistor devices are disclosed herein. An exemplary method includes forming a first opening in a first gate structure and a second opening in a second gate structure. The first gate structure is disposed over a first fin structure, and the second gate structure is disposed over a second fin structure. The method further includes filling the first opening and the second opening by forming a gate dielectric layer, forming a threshold voltage tuning layer over the gate dielectric layer, etching back the threshold voltage tuning layer in the second opening, forming a work function layer over the threshold voltage tuning layer, and forming a metal fill layer over the work function layer. The threshold voltage tuning layer includes tantalum and nitrogen. The etching back uses a tungsten-chloride containing precursor. In some implementations, forming the threshold voltage tuning layer includes performing an atomic layer deposition process. In some implementations, the etching back includes tuning etching parameters to reduce a threshold voltage corresponding with the second gate structure relative to a threshold voltage corresponding with the first gate structure. In some implementations, filling the first opening and the second opening further includes forming a capping layer over the gate dielectric layer, wherein the capping layer is disposed between the gate dielectric layer and the threshold voltage tuning layer.

In some implementations, the work function layer is formed after etching back the threshold voltage tuning layer. In such implementations, the work function layer is a first type work function layer, and filling the first opening and the second opening further includes forming a second type work function layer over the threshold voltage tuning layer in the first opening and the second opening before etching back the threshold voltage tuning layer, removing the second type work function layer from the second opening, thereby exposing the threshold voltage tuning layer in the second opening for the etching back, and forming the first type work function layer over the second type work function layer in the first opening and over the threshold voltage tuning layer in the second opening. In some implementations, the work function layer is before etching back the threshold voltage tuning layer. In such implementations, the work function layer is a first type work function layer, and the filling the first opening and the second opening further includes removing the first type work function layer from the second opening, thereby exposing the threshold voltage tuning layer in the second opening for the etching back, and forming a second type work function layer over the first type work function layer in the first opening after the etching back.

Another exemplary method includes forming a first opening in a first gate structure of a first fin-like field effect transistor (FinFET), a second opening in a second gate structure of a second FinFET, a third opening in a third gate structure of a third FinFET, and a fourth opening in a fourth gate structure of a fourth FinFET. The method further includes partially filling the first opening, the second opening, the third opening, and the fourth opening with a high-k dielectric layer. The method further includes partially filling the first opening, the second opening, the third opening, and the fourth opening with a threshold voltage tuning layer, wherein the threshold voltage tuning layer is disposed over the high-k dielectric layer. The method further includes partially filling the first opening, the second opening, the third opening, and the fourth opening with a first type work function layer, wherein the first type work function layer is disposed over the threshold voltage tuning layer. The method further includes removing the first type work function layer from the second opening and the third opening, thereby exposing the threshold voltage tuning layer in the second opening and the third opening. The method further includes performing a threshold voltage tuning treatment on the threshold voltage tuning layer exposed in the second opening and the third opening, such that a threshold voltage of the second FinFET and the third FinFET is lower than a threshold voltage of the first FinFET and the fourth FinFET, wherein the threshold voltage tuning treatment implements a tungsten-chloride containing precursor. The method further includes partially filling the first opening, the second opening, and the fourth opening with a second type work function layer, wherein the second type work function layer is disposed over the threshold voltage tuning layer in the first opening, the second opening, and the fourth opening. The method further includes filling the first opening, the second opening, the third opening, and the fourth opening with a metal fill layer, wherein the metal fill layer is disposed over the second type work function layer in the first opening, the second opening, and the fourth opening, and further wherein the metal fill layer is disposed over the threshold voltage tuning layer in the third opening. In some implementations, the method further includes partially filling the first opening, the second opening, the third opening, and the fourth opening with a capping layer over the high-k dielectric layer before forming the threshold voltage tuning layer. In some implementations, the method further includes partially filling the first opening, the second opening, and the fourth opening with a glue layer over the second type work function layer.

In some implementations, partially filling the first opening, the second opening, the third opening, and the fourth opening with the threshold voltage tuning layer includes forming a tantalum-and-nitrogen containing layer. In some implementations, partially filling the first opening, the second opening, the third opening, and the fourth opening with the threshold voltage tuning layer includes performing an atomic layer deposition process. In some implementations, performing the threshold voltage tuning treatment includes reducing a thickness of the threshold voltage tuning layer in the second opening and the third opening. In some implementations, the first type work function layer includes a p-type work function material and the second type work function layer includes an n-type work function material. In some implementations, partially filling the first opening, the second opening, the third opening, and the fourth opening with the first type work function layer includes forming the first type work function layer of a first thickness in the first opening and the second opening, and forming the first type work function layer of a second thickness in the third opening and the fourth opening. The second thickness is greater than the first thickness.

An exemplary integrated circuit device includes a first fin-like field effect transistor (FinFET) having a first gate structure that includes a first high-k dielectric layer, a first threshold voltage tuning layer disposed over the first high-k dielectric layer, a first p-type work function layer disposed over the first threshold voltage tuning layer, a first n-type work function layer disposed over the first threshold voltage tuning layer, and a first metal fill layer disposed over the first n-type work function layer. The integrated circuit further includes a second FinFET having a second gate structure that includes a second high-k dielectric layer, a second threshold voltage tuning layer disposed over the second high-k dielectric layer, a second n-type work function layer disposed over the second threshold voltage tuning layer, and a second metal fill layer disposed over the second threshold voltage tuning layer. The integrated circuit further includes a third FinFET having a third gate structure that includes a third high-k dielectric layer, a third threshold voltage tuning layer disposed over the third high-k dielectric layer, and a third metal fill layer disposed over the third threshold voltage tuning layer. The integrated circuit further includes a fourth FinFET having a fourth gate structure that includes a fourth high-k dielectric layer, a fourth threshold voltage tuning layer disposed over the fourth high-k dielectric layer, a second p-type work function layer disposed over the fourth threshold voltage tuning layer, a third n-type work function layer disposed over the fourth threshold voltage tuning layer, and a fourth metal fill layer disposed over the third n-type work function layer. A thickness of the second threshold voltage tuning layer and the third threshold voltage tuning layer is less than a thickness of the first threshold voltage tuning layer and the fourth threshold voltage tuning layer. A thickness of the second p-type work function layer is greater than a thickness of the first p-type work function layer. In some implementations, the first threshold voltage tuning layer, the second threshold voltage tuning layer, the third threshold voltage tuning layer, and the fourth threshold voltage tuning layer include tantalum and nitrogen.

The integrated circuit further includes a first high-k capping layer disposed between the first high-k dielectric layer and the first threshold voltage tuning layer, a second high-k capping layer disposed between the second high-k dielectric layer and the second threshold voltage tuning layer, a third high-k capping layer disposed between the third high-k dielectric layer and the third threshold voltage tuning layer, and a fourth high-k capping layer disposed between the fourth high-k dielectric layer and the fourth threshold voltage tuning layer. In some implementations, the first p-type work function layer and the second p-type work function layer include titanium and nitrogen. In some implementations, the first n-type work function layer, the second n-type work function layer, and the third n-type work function layer include titanium and aluminum. In some implementations, the first metal fill layer, the second metal fill layer, the third metal fill layer, and the fourth metal fill layer include tungsten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit device comprising:
a first fin-like field effect transistor (FinFET) having a first gate structure having a first plurality of layers that includes a first high-k dielectric layer, a first metal capping layer disposed directly on the first high-k dielectric layer, a first metal barrier layer disposed directly on the first metal capping layer, a first p-type work function layer disposed directly on the first metal barrier layer, a first n-type work function layer disposed directly on the first p-type work function layer, and a first metal fill layer disposed over the first n-type work function layer;

a second FinFET having a second gate structure having a second plurality of layers that includes a second high-k dielectric layer, a second metal capping layer disposed directly on the second high-k dielectric layer, a second metal barrier layer disposed directly on the second metal capping layer, a second n-type work function layer disposed directly on the second metal barrier layer, and a second metal fill layer disposed over the second n-type work function layer;

a third FinFET having a third gate structure having a third plurality of layers that includes a third high-k dielectric layer, a third metal capping layer disposed directly on the third high-k dielectric layer, a third metal barrier layer disposed directly on the third metal capping layer, and a third metal fill layer disposed over the third metal barrier layer;

a fourth FinFET having a fourth gate structure having a fourth plurality of layers that includes a fourth high-k dielectric layer, a fourth metal capping layer disposed directly on the fourth high-k dielectric layer, a fourth metal barrier layer disposed directly on the fourth metal capping layer, a second p-type work function layer disposed directly on the fourth metal barrier layer, a third n-type work function layer disposed directly on the second p-type work function layer, and a fourth metal fill layer disposed over the third n-type work function layer;

wherein a total number of the first plurality of layers is greater than a total number of the second plurality of layers;

wherein a total number of the fourth plurality of layers is greater than a total number of the third plurality of layers;

wherein the total number of the second plurality of layers is different than the total number of the third plurality of layers;

wherein the first metal barrier layer has a first thickness, the second metal barrier layer has a second thickness, the third metal barrier layer has a third thickness, and the fourth metal barrier layer has a fourth thickness;

wherein the second thicknesses of the second metal barrier layer is less than the first thickness of the first metal barrier layer and the third thickness of the third metal barrier layer is less than the fourth thickness of the fourth metal barrier layer; and wherein a fifth thickness of the second p-type work function layer is greater than a sixth thickness of the first p-type work function layer.

2. The integrated circuit device of claim 1, wherein:
the first metal capping layer, the second metal capping layer, the third metal capping layer, and the fourth metal capping layer include a first metal and nitrogen; and
the first metal barrier layer, the second metal barrier layer, the third metal barrier layer, and the fourth metal barrier layer include a second metal and nitrogen, wherein the first metal and the second metal are different.

3. The integrated circuit device of claim 2, wherein the first metal barrier layer, the second metal barrier layer, the third metal barrier layer, and the fourth metal barrier layer further include a third metal that is different than the first metal and the second metal.

4. The integrated circuit device of claim 2, wherein the first metal is titanium and the second metal is tantalum.

5. The integrated circuit device of claim 1, wherein:
the first p-type work function layer and the second p-type work function layer include titanium and nitrogen;
the first n-type work function layer, the second n-type work function layer, and the third n-type work function layer include titanium and aluminum; and
the first metal fill layer, the second metal fill layer, the third metal fill layer, and the fourth metal fill layer include tungsten.

6. The integrated circuit device of claim 5, wherein the first n-type work function layer, the second n-type work function layer, and the third n-type work function layer further include carbon.

7. The integrated circuit device of claim 1, wherein the sixth a thickness of the first p-type work function layer is about 10 Å to about 20 Å and the fifth thickness of the second p-type work function layer is about 20 Å to about 40 Å.

8. The integrated circuit device of claim 1, wherein the second thickness of the second metal barrier layer and the third thickness of the third metal barrier layer are each less than or equal to about 15 Å.

9. The integrated circuit device of claim 1, wherein a seventh thickness of the first n-type work function layer is substantially equal to an eighth thickness of the second n-type work function layer and a ninth thickness of the third n-type work function layer.

10. An integrated circuit device comprising:
a high voltage n-type fin-like field effect transistor (FinFET) disposed over a high voltage n-type (HV-N) region of a substrate and a high voltage p-type FinFET disposed over a high voltage p-type (HV-P) region of the substrate;
a low voltage n-type FinFET disposed over a low voltage n-type (LV-N) region of the substrate and a low voltage p-type FinFET disposed over a low voltage p-type (LV-P) region of the substrate, wherein a threshold voltage of the high voltage n-type FinFET is greater than a threshold voltage of the low voltage n-type FinFET and a threshold voltage of the high voltage p-type FinFET is greater than a threshold voltage of the low voltage p-type FinFET;
wherein the high voltage n-type FinFET, the high voltage p-type FinFET, the low voltage n-type FinFET, and the low voltage p-type FinFET each include a first metal layer disposed directly on a gate dielectric layer, a second metal layer disposed directly on the first metal layer, and a third metal layer disposed directly on the second metal layer, wherein the first metal layer includes titanium and nitrogen, the second metal layer includes tantalum and nitrogen, the third metal layer includes titanium and nitrogen in the high voltage n-type FinFET, the high voltage p-type FinFET, and the low voltage p-type FinFET, and the third metal layer includes titanium and aluminum in the low voltage n-type FinFET; and
wherein a first thickness of the second metal layer of the low voltage n-type FinFET is less than a second thickness of the second metal layer of the high voltage n-type FinFET and a third thickness of the second metal layer of the low voltage p-type FinFET is less than a fourth thickness of the second metal layer of the high voltage p-type FinFET.

11. The integrated circuit device of claim 10, wherein the second thickness of the second metal layer of the high voltage n-type FinFET is substantially equal to the fourth thickness of the second metal layer of the high voltage p-type FinFET.

12. The integrated circuit device of claim 10, wherein the second metal layer of the low voltage n-type FinFET and the second metal layer of the low voltage p-type FinFET further include tungsten.

13. The integrated circuit device of claim 10, wherein a fifth thickness of the third metal layer of the high voltage p-type FinFET is greater than a sixth thickness of the third metal layer of the high voltage n-type FinFET.

14. The integrated circuit device of claim 10, wherein:
the high voltage n-type FinFET, the high voltage p-type FinFET, the low voltage n-type FinFET, and the low voltage p-type FinFET each include a fourth metal layer disposed directly over the third metal layer and a fifth metal layer disposed directly on the fourth metal layer; and
the fourth metal layer includes titanium and nitrogen and the fifth metal layer includes tungsten.

15. The integrated circuit device of claim 14, wherein:
the fourth metal layer is disposed directly on the third metal layer in the low voltage n-type FinFET and the low voltage p-type FinFET; and
the high voltage n-type FinFET and the high voltage p-type FinFET each include a sixth metal layer disposed between the third metal layer and the fourth metal layer, such that the sixth metal layer is disposed directly on third metal layer and the fourth metal layer is disposed directly on the sixth metal layer, and wherein the sixth metal layer includes titanium and aluminum.

16. The integrated circuit device of claim 10, wherein the high voltage n-type FinFET and the low voltage n-type FinFET have a threshold voltage of about 0.1 V to about 0.25 V, and the high voltage p-type FinFET and the low voltage p-type FinFET have a threshold voltage of about 0.14 V to about 0.29 V.

17. An integrated circuit device comprising:
a first gate structure disposed on a first fin structure, a second gate structure disposed on a second fin structure, a third gate structure disposed on a third fin structure, and a fourth gate structure disposed on a fourth fin structure, wherein:
the first gate structure includes a first high-k dielectric layer, a first titanium-and-nitrogen comprising layer disposed on the first high-k dielectric layer, a first tantalum-and-nitrogen comprising layer disposed on the first titanium-and-nitrogen comprising layer, a second titanium-and-nitrogen comprising layer disposed on the first tantalum-and-nitrogen comprising layer, a first titanium-and-aluminum comprising layer disposed on the second titanium-and-nitrogen comprising layer, and a first tungsten comprising layer disposed over the first titanium-and-aluminum comprising layer;
the second gate structure includes a second high-k dielectric layer, a third titanium-and-nitrogen comprising layer disposed on the second high-k dielectric layer, a second tantalum-and-nitrogen comprising layer disposed on the third titanium-and-nitrogen comprising layer, a second titanium-and-aluminum comprising layer disposed on the second tantalum-and-nitrogen comprising layer, and a second tungsten comprising layer disposed over the second titanium-and-aluminum comprising layer;
the third gate structure includes a third high-k dielectric layer, a fourth titanium-and-nitrogen comprising layer disposed on the third high-k dielectric layer, a third tantalum-and-nitrogen comprising layer disposed on the fourth titanium-and-nitrogen comprising layer, a fifth titanium-and-nitrogen comprising layer disposed on the third tantalum-and-nitrogen comprising layer, a third titanium-and-aluminum comprising layer disposed on the fifth titanium-and-nitrogen comprising layer, and a third tungsten comprising layer disposed over the third titanium-and-aluminum comprising layer;
the fourth gate structure includes a fourth high-k dielectric layer, a sixth titanium-and-nitrogen comprising layer disposed on the fourth high-k dielectric layer, a fourth tantalum-and-nitrogen comprising layer disposed on the sixth titanium-and-nitrogen comprising layer, and a fourth tungsten comprising layer disposed over the fourth tantalum-and-nitrogen comprising layer;
a thickness of the second tantalum-and-nitrogen comprising layer is less than a thickness of the first tantalum-and-nitrogen comprising layer;
a thickness of the fourth tantalum-and-nitrogen comprising layer is less than a thickness of the third tantalum-and-nitrogen comprising layer; and
the first gate structure further includes a seventh titanium-and-nitrogen comprising layer and an eighth titanium-and-nitrogen comprising layer disposed directly between the first tungsten comprising layer and the first titanium-and-aluminum comprising layer;
the second gate structure further includes a ninth titanium-and-nitrogen comprising layer and a tenth titanium-and-nitrogen comprising layer disposed directly between the second tungsten comprising layer and the second titanium-and-aluminum comprising layer;
the third gate structure further includes an eleventh titanium-and-nitrogen comprising layer and a twelfth titanium-and-nitrogen comprising layer disposed directly between the third tungsten comprising layer and the third titanium-and-aluminum comprising layer; and
the fourth gate structure further includes a thirteenth titanium-and-nitrogen comprising layer disposed directly between the fourth tungsten comprising layer and the fourth tantalum-and-nitrogen comprising layer.

18. The integrated circuit device of claim 17, wherein a thickness of the fifth titanium-and-nitrogen comprising layer is greater than a thickness of the second titanium-and-nitrogen comprising layer.

19. The integrated circuit device of claim 17, wherein the second tantalum-and-nitrogen comprising layer and the fourth tantalum-and-nitrogen comprising layer further include tungsten.

20. The integrated circuit device of claim 17, wherein the first titanium-and-aluminum comprising layer, the second titanium-and-aluminum comprising layer, and the third titanium-and-aluminum comprising layer further include carbon.

* * * * *